US012572175B2

(12) United States Patent
Kim et al.

(10) Patent No.:  US 12,572,175 B2
(45) Date of Patent:      Mar. 10, 2026

(54) DISPLAY DEVICE

(71) Applicant: LG Display Co., Ltd., Seoul (KR)

(72) Inventors: Myungsung Kim, Paju-si (KR); Sujin Ham, Seoul (KR); Myungsub Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 176 days.

(21) Appl. No.: 18/474,976

(22) Filed: Sep. 26, 2023

(65) Prior Publication Data

US 2024/0219966 A1     Jul. 4, 2024

(30) Foreign Application Priority Data

Dec. 28, 2022     (KR) ........................ 10-2022-0187936

(51) Int. Cl.
*G06F 1/16*          (2006.01)
*H10D 86/40*       (2025.01)
*H10D 86/60*       (2025.01)

(52) U.S. Cl.
CPC ......... *G06F 1/1652* (2013.01); *H10D 86/411* (2025.01); *H10D 86/441* (2025.01); *H10D 86/60* (2025.01)

(58) Field of Classification Search
CPC .... H10D 86/411; H10D 86/441; H10D 86/60; G06F 1/1652; H10K 59/131; H10K 59/1201; H10K 59/873; H10K 71/00; H10K 77/111; H10K 50/844; H10K 2102/311; G09G 3/3225; G09G 2380/02
See application file for complete search history.

(56) References Cited

U.S. PATENT DOCUMENTS

| | | | | | |
|---|---|---|---|---|---|
| 11,776,971 | B2 * | 10/2023 | Sui | ......................... | H10D 86/60 257/79 |
| 2002/0094701 | A1 * | 7/2002 | Biegelsen | .............. | B25J 13/084 439/32 |
| 2009/0317639 | A1 * | 12/2009 | Axisa | ................... | H05K 1/0283 428/411.1 |
| 2010/0233843 | A1 * | 9/2010 | Frolov | .................. | H01L 25/043 257/E31.119 |

(Continued)

FOREIGN PATENT DOCUMENTS

| | | | | | |
|---|---|---|---|---|---|
| CN | 112562515 | A | * | 3/2021 | ............. G09F 9/301 |
| KR | 10-2020-0052789 | A | | 5/2020 | |
| KR | 20240104621 | A | * | 7/2024 | |

*Primary Examiner* — Kenneth Bukowski
(74) *Attorney, Agent, or Firm* — Seed Intellectual Property Law Group LLP

(57)          ABSTRACT

According to an aspect of the present disclosure a display device is described. The display device includes: a lower substrate which is stretchable and divided into a first area, a second area, and a third area. The display device includes a plurality of conductive patterns disposed in the first area of the lower substrate. The display device includes a plurality of pixels disposed in the second area of the lower substrate. The display device includes a plurality of connection lines disposed in the third area of the lower substrate and respectively connected to the plurality of pixels, in which the plurality of conductive patterns is disposed on the same layer and includes first conductive pattern and second conductive pattern spaced apart from each other, thereby suppressing excessive stretching of the display device.

19 Claims, 12 Drawing Sheets

(56)             References Cited

U.S. PATENT DOCUMENTS

| | | | | |
|---|---|---|---|---|
| 2017/0005077 A1* | 1/2017 | Kim | .................... | H05K 1/0274 |
| 2017/0294610 A1* | 10/2017 | Sasaki | ................. | H10K 77/111 |
| 2018/0046221 A1* | 2/2018 | Choi | ..................... | H05B 33/22 |
| 2018/0090699 A1* | 3/2018 | Shin | ..................... | H10K 59/353 |
| 2020/0051964 A1* | 2/2020 | Jung | .................... | H01L 25/167 |
| 2020/0111390 A1* | 4/2020 | Kim | ........................ | G09F 9/301 |
| 2020/0111978 A1* | 4/2020 | Kim | .................... | H10D 86/443 |
| 2020/0144522 A1* | 5/2020 | Jung | .................... | H10K 59/131 |
| 2020/0201393 A1* | 6/2020 | Ahn | ........................ | G09F 9/301 |
| 2020/0211437 A1* | 7/2020 | Ahn | ........................ | G09G 3/20 |
| 2020/0212117 A1* | 7/2020 | Jeon | ...................... | H10K 71/00 |
| 2021/0098555 A1* | 4/2021 | Kim | .................... | H10K 59/121 |
| 2021/0111167 A1* | 4/2021 | Kang | ................. | H10H 20/8581 |
| 2021/0135133 A1* | 5/2021 | Zhu | ...................... | H10K 77/111 |
| 2021/0375835 A1* | 12/2021 | Kang | ................. | H01L 23/5387 |
| 2022/0139888 A1* | 5/2022 | Kim | ........................ | G09G 3/20 |
| | | | | 257/89 |
| 2022/0206619 A1* | 6/2022 | Kim | ........................ | G06F 3/044 |
| 2024/0047444 A1* | 2/2024 | Lee | ..................... | H10H 29/142 |
| 2024/0153969 A1* | 5/2024 | Jeong | ................. | H10D 86/443 |

* cited by examiner

DISPLAY DEVICE

CROSS-REFERENCE TO RELATED APPLICATIONS

This application claims the priority of Korean Patent Application No. 10-2022-0187936 filed on Dec. 28, 2022, in the Korean Intellectual Property Office, the disclosure of which is incorporated herein by reference.

BACKGROUND

Technical Field

The present disclosure relates to a stretchable display device.

Description of the Related Art

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, display devices have been made by forming display parts, lines, and the like on substrates made of flexible plastic materials and having flexibility. The display devices are manufactured to be stretchable in particular directions and variously changeable in shapes, and thus attract attention as next-generation display devices.

BRIEF SUMMARY

Various embodiments of the present disclosure provide a display device configured to suppress excessive stretching.

The technical benefits of the present disclosure are not limited to the above-mentioned benefits, and other benefits, which are not mentioned above, can be clearly understood by those skilled in the art from the following descriptions.

According to an aspect of the present disclosure, a display device includes: a lower substrate which is stretchable and divided into a first area, a second area, and a third area; a plurality of conductive patterns disposed in the first area of the lower substrate; a plurality of pixels disposed in the second area of the lower substrate; and a plurality of connection lines disposed in the third area of the lower substrate and respectively connected to the plurality of pixels, in which the plurality of conductive patterns is disposed on the same layer and includes first conductive pattern and second conductive pattern spaced apart from each other, thereby suppressing excessive stretching of the display device.

Other detailed matters of the exemplary embodiments are included in the detailed description and the drawings.

According to the present disclosure, the light-emitting element may operate abnormally in case that the light-emitting element is excessively stretched out of the allowable range. Therefore, the user may recognize whether the display device of the present disclosure is excessively stretched, and the user does not excessively stretch the display device, which may ensure reliability related to the repeated operations of stretching the display device.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
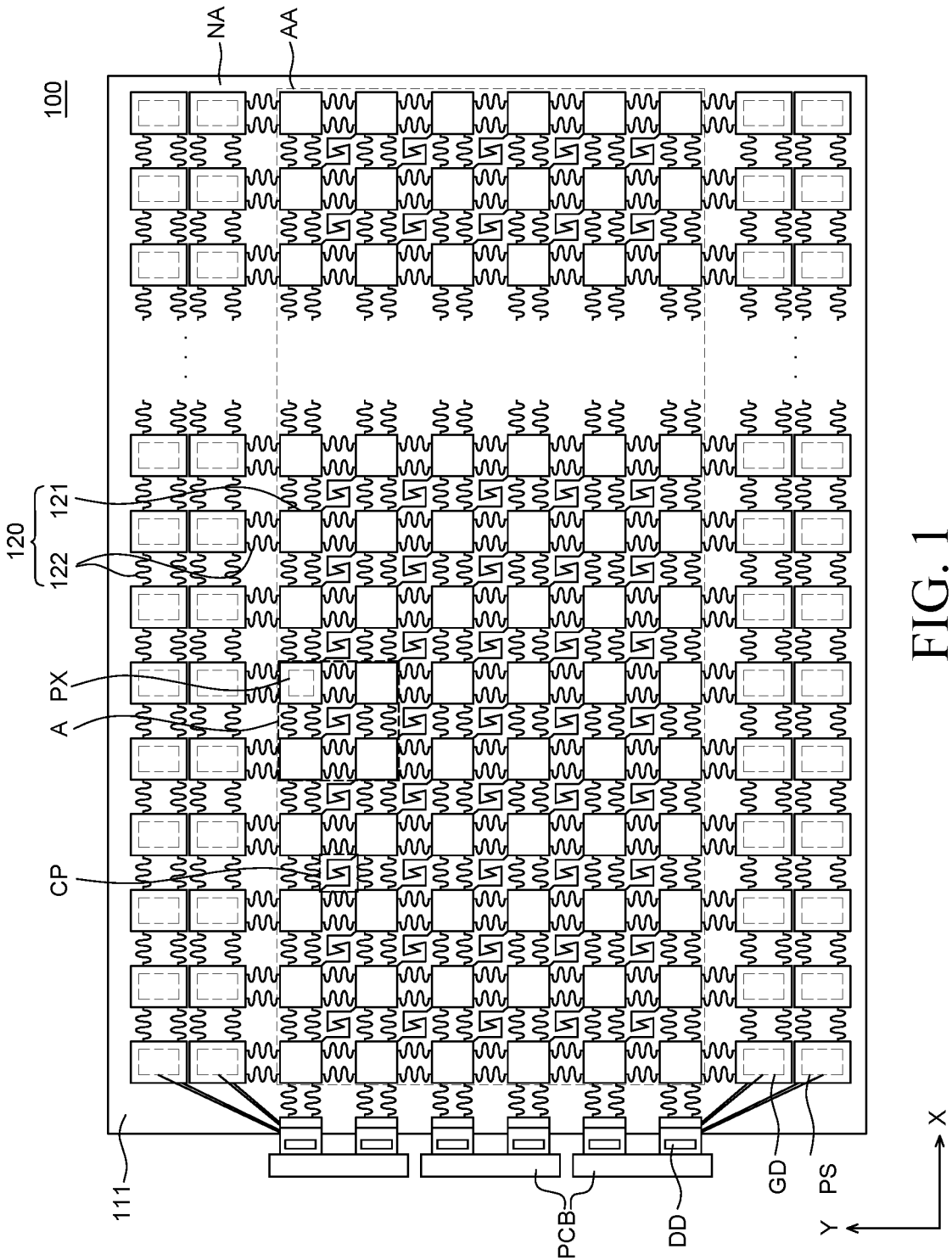
FIG. 1 is a top plan view illustrating a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including." "having." and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

A display device according to an exemplary embodiment of the present disclosure is a display device capable of displaying images even when being bent or stretched. The display device may also be referred to as a stretchable display device, a flexible display device, and an extendable display device. The display device may have not only high flexibility but also stretchability in comparison with a general display device in the related art. Therefore, a user may bend or stretch the display device, and a shape of the display device may be freely changed in accordance with the user's manipulation. For example, in case that the user holds and pulls an end of the display device, the display device may be stretched in a direction in which the user pulls the display device. Alternatively, in case that the user disposes the display device on a non-flat outer surface, the display device may be disposed to be curved along a shape of an outer surface of a wall surface. In addition, when the force applied by the user is eliminated, the display device may be restored back to an original shape.

Stretchable Substrate and Pattern Layer

FIG. 1 is a top plan view illustrating a display device according to an exemplary embodiment of the present disclosure.

Figure 2:
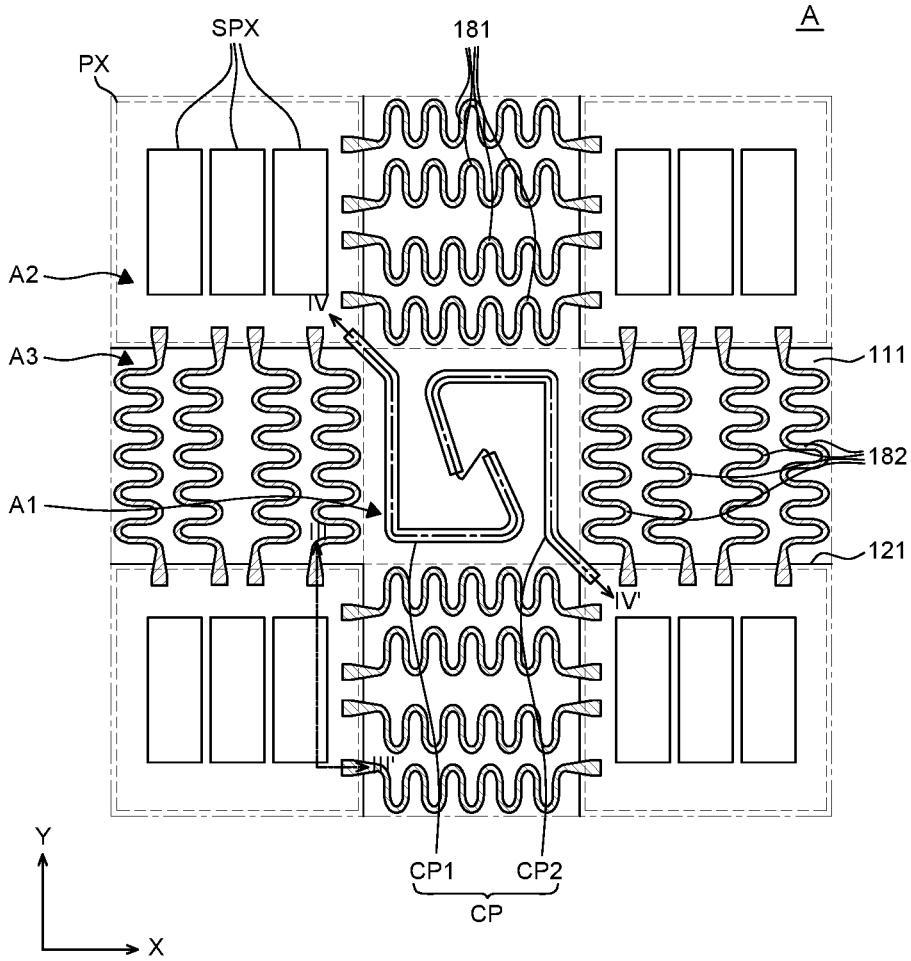
FIG. 2 is an enlarged top plan view of the display device according to the exemplary embodiment of the present disclosure.

FIG. 2 is an enlarged top plan view of the display device according to the exemplary embodiment of the present disclosure.

Figure 3:
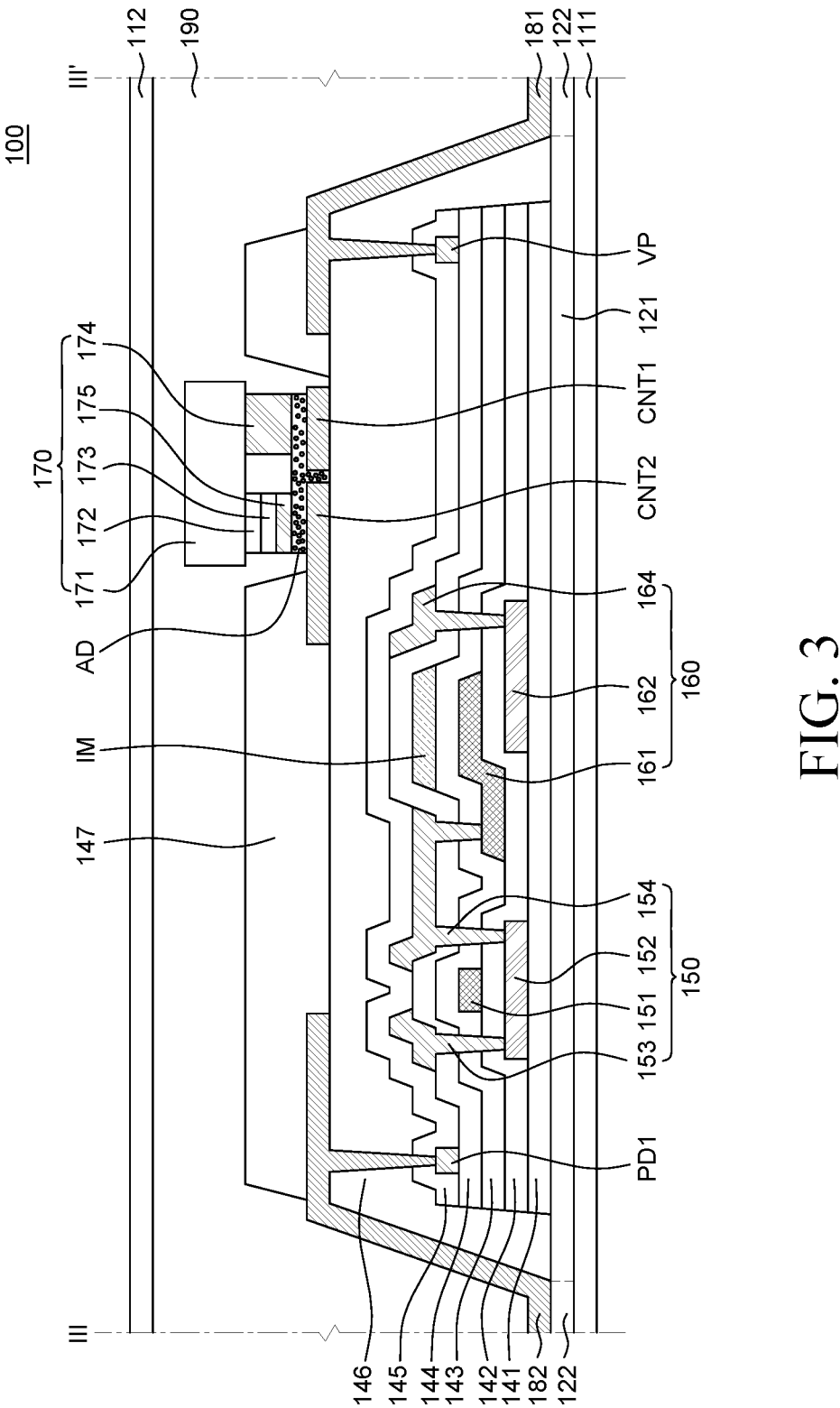
FIG. 3 is a cross-sectional view taken along cutting line III-III' illustrated in FIG. 2.

FIG. 3 is a cross-sectional view taken along cutting line III-III' illustrated in FIG. 2.

Specifically, FIG. 2 is an enlarged top plan view of area A illustrated in FIG. 1.

Figure 4A:
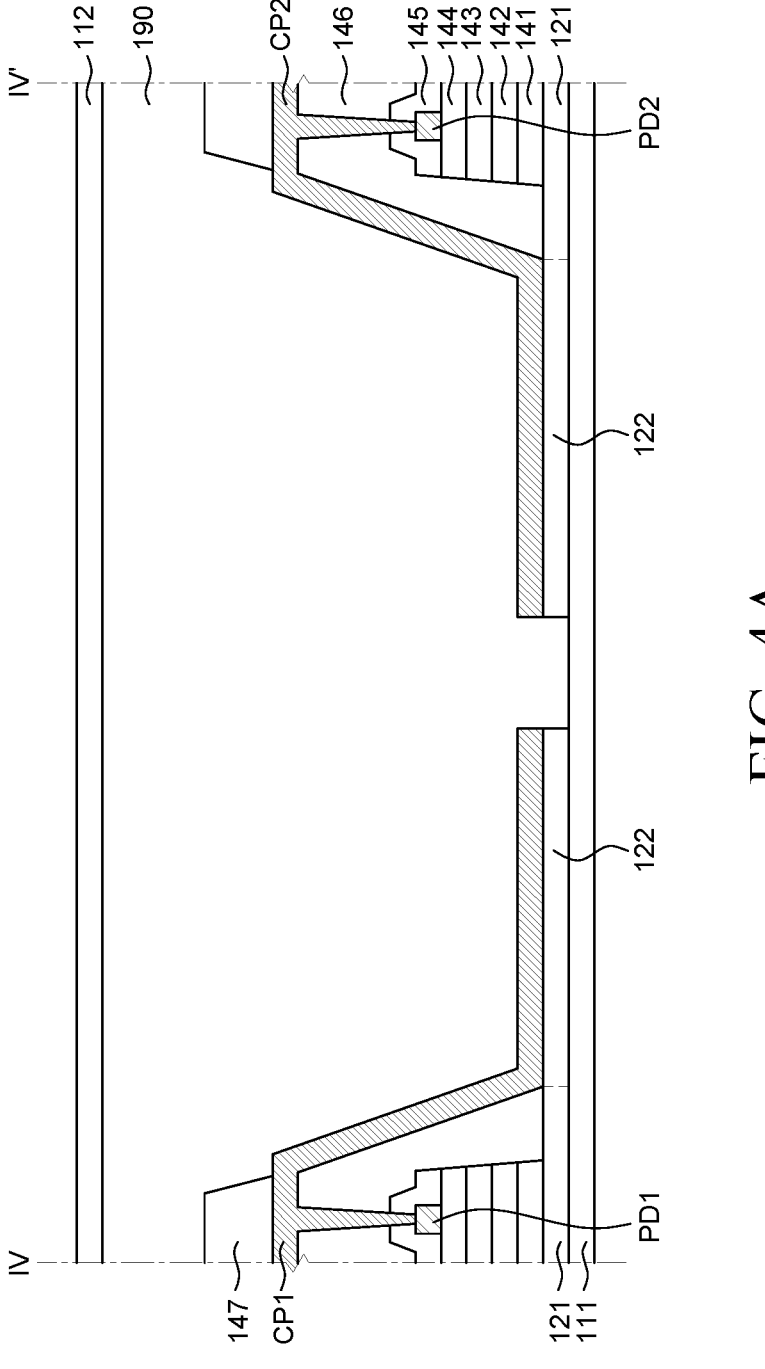
FIGS. 4A and 4B are cross-sectional views taken along cutting line IV-IV' illustrated in FIG. 2.

With reference to FIG. 1, a display device 100 according to an exemplary embodiment of the present disclosure may include a lower substrate 111, a pattern layer 120, a plurality of conductive patterns CP, a plurality of pixels PX, a gate driver GD, a data driver DD, and a power supply PS. With reference further to FIGS. 3 and 4A, in the exemplary embodiment, the display device 100 may further include a filling layer 190 and an upper substrate 112.

The lower substrate 111 is a substrate configured to support and protect several constituent elements of the display device 100. Further, the upper substrate 112 is a substrate configured to cover and protect several constituent elements of the display device 100. That is, the lower substrate 111 is a substrate configured to support the pattern layer 120 on which the pixel PX, the plurality of conductive patterns CP, the gate driver GD, and the power supply PS are formed. Further, the upper substrate 112 is a substrate configured to cover the pixel PX, the gate driver GD, and the power supply PS.

The lower substrate 111 and the upper substrate 112 may each be a flexible substrate made of an insulating material that is bendable or stretchable. For example, the lower substrate 111 and the upper substrate 112 may each include silicone rubber such as polydimethylsiloxane (PDMS) or elastomer such as polyurethane (PU) or polytetrafluoroethylene (PTFE). Therefore, the lower substrate 111 and the upper substrate 112 may each have flexibility. According to the exemplary embodiment, the lower substrate 111 and the upper substrate 112 may be made of the same material. However, the present disclosure is not limited thereto. The lower substrate 111 and the upper substrate 112 may be variously modified.

The lower substrate 111 and the upper substrate 112 may each be a flexible substrate that may reversibly expand and contract. Therefore, the lower substrate 111 may also be referred to as a lower stretchable substrate, a lower contractible substrate, a lower extendable substrate, a lower flexible substrate, a lower ductile substrate, a first stretchable substrate, a first contractible substrate, a first extendable substrate, a first flexible substrate, or a first ductile substrate. The upper substrate 112 may also be referred to as an upper stretchable substrate, an upper contractible substrate, an upper extendable substrate, an upper flexible substrate, an upper ductile substrate, a second stretchable substrate, a second contractible substrate, a second extendable substrate, a second flexible substrate, or a second ductile substrate. In addition, the lower substrate 111 and the upper substrate 112 may each have an elastic modulus of several MPa to several hundreds of MPa. In addition, a ductile breaking rate of each of the lower substrate 111 and the upper substrate 112 may be 100% or more. In this case, the ductile breaking rate means an elongation ratio at a time point at which a stretching object breaks or cracks. In addition, a thickness of the lower substrate 111 may be 10 μm to 1 mm. However, the present disclosure is not limited thereto.

The lower substrate 111 may include a display area (active area AA), and a non-display area (non-active area NA) configured to surround the display area AA. However, the display area AA and the non-display area (non-active area NA) may be referred to for explaining the entire display device 100 without being referred to for explaining only the lower substrate 111.

The display area AA may be an area of the display device 100 in which images are displayed. The plurality of pixels PX may be disposed in the display area AA. The pixels PX may each include display elements, and various driving elements for operating the display elements. Various driving elements may include at least one thin-film transistor (TFT) and at least one capacitor. However, the present disclosure is not limited thereto. In addition, the plurality of pixels PX may each be connected to various lines. For example, the plurality of pixels PX may each be connected to various lines such as gate lines, data lines, high-potential voltage lines, low-potential voltage lines, reference voltage lines, and initialization voltage lines.

In addition, the plurality of conductive patterns CP may be disposed in the display area AA to determine whether the display device 100 is excessively stretched. In one embodiment, the text "excessively stretched" means that the display device 100 is stretched beyond its normal form (e.g., unstretched state) of the display device 100 and stretched beyond a selected threshold such that the display device 100 does not properly function as a display device. In one example, if the display device 100 is stretched beyond the selected threshold (or a selected threshold value), the individual pixels might not emit light properly with driven. Further, if display device 100 is structured to point that some structures may be broken, an electric circuit becomes open or destroyed and no longer properly functions when stretched, it has been excessively stretched. The plurality of conductive patterns CP may be disposed between the plurality of pixels PX.

The non-display area NA may be an area in which no image is displayed. The non-display area NA may be disposed adjacent to the display area AA. For example, the non-display area NA may be an area that surrounds the display area AA. However, the present disclosure is not limited thereto. The non-display area NA may be an area of the lower substrate 111 that excludes the display area AA. The non-display area NA may be modified and divided into various shapes. Constituent elements for operating the plurality of pixels PX disposed in the display area AA may be disposed in the non-display area NA. The gate driver GD and the power supply PS may be disposed in the non-display area NA. In addition, a plurality of pads connected to the gate driver GD and the data driver DD may be disposed in the non-display area NA. The pads may be respectively connected to the plurality of pixels PX in the display area AA.

The pattern layer 120 may be disposed between the lower substrate 111 and the upper substrate 112.

Specifically, as illustrated in FIG. 2, the pattern layer 120 may include a plurality of plate patterns 121 disposed in the form of islands spaced apart from one another, and a plurality of line patterns 122 configured to connect the plurality of plate patterns 121.

Further, the plurality of pixels PX may be formed on the plurality of plate patterns 121 disposed in the display area AA. In addition, the gate drivers GD and the power supplies PS may be formed on the plurality of plate patterns 121 disposed in the non-display area NA.

Further, the plurality of plate patterns 121 may be individually separated. Therefore, the plurality of plate patterns 121 may also be referred to as a plurality of island patterns or individual patterns.

In the exemplary embodiment, the gate drivers GD may be mounted on the plurality of plate patterns 121 disposed in the non-display area NA. Various circuit components, such as various transistor, capacitors, lines, and the like, which constitute the gate drivers GD, may be disposed on the plurality of plate patterns 121 disposed in the non-display area NA. However, this configuration is provided for illustrative purposes only, and the exemplary embodiment of the present disclosure is not limited thereto. The gate drivers GD may be mounted on the plurality of plate patterns 121 disposed in the non-display area NA in a chip-on-film (COF) manner.

In the exemplary embodiment, the power supplies PS may be mounted on the plurality of plate patterns 121 disposed in the non-display area NA. Power blocks, which are disposed on different layers, may be disposed on the plurality of plate patterns 121 disposed in the non-display area NA. That is, the lower and upper power blocks may be sequentially disposed on the plurality of plate patterns 121 disposed in the non-display area NA. For example, a low-potential voltage may be applied to the lower power block, and a high-potential voltage may be applied to the upper power block. Therefore, the low-potential voltage may be supplied to the plurality of pixels PX through the lower power block, and the high-potential voltage may be supplied to the plurality of pixels PX through the upper power block.

According to the exemplary embodiment, as illustrated in FIG. 1, a size of each of the plurality of plate patterns 121 disposed in the non-display area NA may be larger than a size of each of the plurality of plate patterns 121 disposed in the display area AA. More specifically, an area occupied by various circuit components, which constitute one stage of the gate driver GD, is relatively larger than an area occupied by the pixel PX, such that a size of each of the plurality of plate patterns 121 disposed in the non-display area NA may be larger than a size of each of the plurality of plate patterns 121 disposed in the display area AA.

FIG. 1 illustrates that the plurality of plate patterns 121 disposed in the plurality of non-display areas NA is disposed at two opposite sides based on a second direction Y in the non-display area NA. However, this configuration is provided for illustrative purposes only, and the exemplary embodiment of the present disclosure is not limited thereto. For example, the plurality of plate patterns 121 disposed in the non-display area NA may be disposed in any area of the non-display area NA. In addition, FIGS. 1 and 2 illustrate that the plurality of plate patterns 121 each has a quadrangular shape. However, this configuration is provided for illustrative purposes only, and the exemplary embodiment of the present disclosure is not limited thereto. The plurality of plate patterns 121 may be modified in various shapes.

Meanwhile, the plurality of line patterns 122 is each a pattern that connects the adjacent plate patterns 121. The line pattern may also be referred to as a connection pattern. That is, the plurality of line patterns 122 may be disposed between the plurality of plate patterns 121.

In the exemplary embodiment, with reference to FIG. 1, the plurality of line patterns 122 may each have a curved shape. For example, the plurality of line patterns 122 may each have a sinusoidal shape. However, this configuration is provided for illustrative purposes only. The shape of each of the plurality of line patterns 122 is not limited thereto. For example, the plurality of line patterns 122 may each have a zigzag shape. As another example, the plurality of line patterns 122 may each have various shapes such as a shape in which a plurality of rhombic substrates is connected and extended at vertices thereof. As described above, the numbers and shapes of the plurality of line patterns 122 illustrated in FIG. 1 are provided for illustrative purposes only. The plurality of line patterns 122 may be variously changed in numbers and shapes in accordance with design.

In the exemplary embodiment, the plurality of plate patterns 121 and the plurality of line patterns 122 may each be a rigid pattern. For example, the plurality of plate patterns 121 and the plurality of line patterns 122 may each be more rigid than each of the lower substrate 111 and the upper substrate 112. Therefore, the plurality of plate patterns 121 and the plurality of line patterns 122 may each have an elastic modulus higher than an elastic modulus of each of the lower substrate 111 and the upper substrate 112. The elastic modulus (modulus of elasticity) refers to a parameter that indicates a ratio of the substrate deformed by stress applied to the substrate. Hardness may increase relatively as the elastic modulus increases relatively. The elastic modulus of each of the plurality of plate patterns 121 and the plurality of line patterns 122 may be 1000 times higher than the elastic modulus because of the lower substrate 111 and the upper substrate 112. However, this configuration is provided for illustrative purposes only, and the exemplary embodiment of the present disclosure is not limited thereto.

In the exemplary embodiment, the plurality of plate patterns 121 and the plurality of line patterns 122 may each include a plastic material having lower flexibility than those of the lower substrate 111 and the upper substrate 112. For example, the plurality of plate patterns 121 and the plurality of line patterns 122 may each include at least one material among polyimide (PI), polyacrylate, and polyacetate. According to the exemplary embodiment, the plurality of plate patterns 121 and the plurality of line patterns 122 may be made of the same material. However, the present disclosure is not limited thereto. The plurality of plate patterns 121 and the plurality of line patterns 122 may be made of different materials. In case that the plurality of plate patterns 121 and the plurality of line patterns 122 are made of the same material, the plurality of plate patterns 121 and the plurality of line patterns 122 may be integrated.

In several exemplary embodiments, the lower substrate 111 may be defined as including a plurality of first lower patterns and a second lower pattern. The plurality of first lower patterns may be areas that overlap the plurality of plate patterns 121 of the lower substrate 111. The second lower pattern may be an area that does not overlap the plurality of plate patterns 121.

In addition, the upper substrate 112 may be defined as including a plurality of first upper patterns and a second upper pattern. The plurality of first upper patterns may be areas that overlap the plurality of plate patterns 121 of the upper substrate 112, and the second upper pattern may be an area that does not overlap the plurality of plate patterns 121.

In this case, the plurality of first lower patterns and the plurality of first upper patterns may each have an elastic modulus higher than an elastic modulus of each of the second lower pattern and the second upper pattern. For example, the plurality of first lower patterns and the first upper pattern may be made of the same material as the plurality of plate patterns 121. The second lower pattern and the second upper pattern may each be made of a material having a lower elastic modulus than a material of each of the plurality of plate patterns 121.

For example, the first lower pattern and the first upper pattern may each be made of polyimide (PI), polyacrylate, polyacetate, or the like. The second lower pattern and the second upper pattern may each be made of silicone rubber such as polydimethylsiloxane (PDMS) or elastomer such as polyurethane (PU) or polytetrafluoroethylene (PTFE).

Non-Display Area Driving Element

The gate driver GD may supply gate voltages to the plurality of pixels PX disposed in the display area AA. The gate drivers GD may include a plurality of stages formed on the plurality of plate patterns 121 disposed in the non-display area NA. The stages included in the gate driver GD may be electrically connected to one another through a plurality of gate connection lines. Therefore, the gate voltage outputted from any one stage may be transmitted to another stage. Further, the stages may sequentially supply the gate voltages to the plurality of pixels PX respectively connected to the stages.

The power supply PS may be connected to the gate driver GD and supply a gate drive voltage and a gate clock voltage to the gate driver GD. Further, the power supply PS may be connected to the plurality of pixels PX and supply pixel drive voltages to the plurality of pixels PX. In addition, the power supplies PS may be formed on the plurality of plate patterns 121 disposed in the non-display area NA. That is, the power supplies PS may be formed on the plurality of plate patterns 121 disposed in the non-display area NA. The power supply PS may be disposed adjacent to the gate driver GD. Further, the plurality of power supplies PS formed on the plurality of plate patterns 121 disposed in the non-display area NA may be electrically connected to the gate driver GD and the plurality of pixels PX. That is, the plurality of power supplies PS formed on the plurality of plate patterns 121 disposed in the non-display area NA may be connected to the gate drivers GD and the plurality of pixels PX by gate power connection lines and pixel power connection lines. Therefore, the plurality of power supplies PS may each supply the gate drive voltage, the gate clock voltage, and the pixel drive voltage.

A printed circuit board PCB may transmit signals and voltages for operating the display elements to the display elements from a controller. Therefore, the printed circuit board PCB may be referred to as a drive substrate. A controller such as IC chips and circuit parts may be mounted on the printed circuit board PCB. In addition, memories, processors, and the like may be mounted on the printed circuit board PCB. Further, the printed circuit board PCB provided in the display device 100 may include a stretchable area and a non-stretchable area to ensure stretchability. Further, IC chips, circuit parts, memories, processors, and the like may be mounted in the non-stretchable area. Lines electrically connected to the IC chips, the circuit parts, the memories, and the processors may be disposed in the stretchable area.

The data driver DD may supply data voltages to the plurality of pixels PX disposed in the display area AA. The data driver DD may be configured in the form of an IC chip, and thus referred to as a data integrated circuit (D-IC). Further, the data driver DD may be mounted in the non-stretchable area of the printed circuit board PCB. That is, the data driver DD may be mounted on the printed circuit board PCB in a chip-on-board (COB) manner. FIG. 1 illustrates that the data driver DD is mounted in a chip-on-film (COF) manner. However, the present disclosure is not limited thereto. The data driver DD may be mounted in a chip-on-board (COF) manner, a chip-on-glass (COG) manner, a tape carrier package (TCP) manner, and the like.

In addition, FIG. 1 illustrates that a single data driver DD is disposed to correspond to one row of plate patterns 121 disposed in the display area AA. However, the present disclosure is not limited thereto. For example, the single data driver DD may be disposed to correspond to a plurality of rows of plate patterns 121.

Meanwhile, with reference to FIG. 2, the display area AA of the display device 100 according to the exemplary embodiment of the present disclosure may be divided into a first area A1 in which the plurality of conductive patterns CP is disposed, a second area A2 in which the plurality of pixels PX is disposed, and a third area A3 in which a plurality of connection lines 181 and 182 is disposed. In other words, the display area AA of the lower substrate 111 may be divided into the first area A1 in which the plurality of conductive patterns CP is disposed, the second area A2 in which the plurality of pixels PX is disposed, and the third area A3 in which the plurality of connection lines 181 and 182 is disposed.

Planar and Cross-Sectional Structures

With reference further to FIGS. 2 and 3, the pixel PX including a plurality of subpixels SPX may be disposed on the plate pattern 121 disposed on the lower substrate 111. The plurality of subpixels SPX may include a light-emitting element 170, which is a display element, and a driving transistor 160 and a switching transistor 150 for operating the light-emitting element 170. However, in the subpixel SPX, the light-emitting element 160 is not limited to an LED but may be changed to an organic light-emitting diode. Further, the plurality of subpixels SPX may include a red subpixel, a green subpixel, and a blue subpixel. However, the present disclosure is not limited thereto. The colors of the plurality of subpixels SPX may be variously changed, as necessary.

The plurality of subpixels SPX may be connected to the plurality of connection lines 181 and 182. For example, the plurality of subpixels SPX may be electrically connected to a first connection line 181 extending in a first direction X, and the plurality of subpixels SPX may be electrically connected to a second connection line 182 extending in the second direction Y.

Meanwhile, with reference to FIG. 3, a plurality of inorganic insulation layers may be disposed on the plurality of plate patterns 121. For example, the plurality of inorganic insulation layers may include a buffer layer 141, a gate insulation layer 142, a first interlayer insulation layer 143, a second interlayer insulation layer 144, and a passivation layer 145. However, the exemplary embodiment of the present disclosure is not limited thereto. Various inorganic insulation layers may be additionally disposed on the plurality of plate patterns 121. Alternatively, at least one of the buffer layer 141, the gate insulation layer 142, the first interlayer insulation layer 143, the second interlayer insulation layer 144, and the passivation layer 145, which are inorganic insulation layers, may be excluded.

More specifically, the buffer layer 141 may be disposed on the plurality of plate patterns 121. The buffer layer 141 may be formed on the plurality of plate patterns 121 in order to protect various constituent elements of the display device 100 from penetration of moisture ($H_2O$) and oxygen ($O_2$) from the outside of the lower substrate 111 and the plurality of plate patterns 121. The buffer layer 141 may be made of an insulating material. For example, the buffer layer 141 may be configured as a single layer or multilayer made of at least one of silicon nitride (SiNx), silicon oxide (SiOx), and silicon oxynitride (SiON). However, the buffer layer 141 may be excluded in accordance with the structure or properties of the display device 100.

In this case, the buffer layer 141 may be formed only in an area in which the lower substrate 111 overlaps the plurality of plate patterns 121. As described above, because the buffer layer 141 may be made of an inorganic material, the display device 100 may be easily damaged or crack during a process of stretching the display device 100. Therefore, the buffer layer 141 is not formed in an area between the plurality of plate patterns 121 but may be formed only on upper portions of the plurality of plate patterns 121 by being patterned in shapes of the plurality of plate patterns 121. Therefore, in the display device 100 according to the exemplary embodiment of the present disclosure, the buffer layer 141 is formed only in the area that overlaps the plurality of plate patterns 121 that is rigid patterns. Therefore, it is possible to suppress damage to various constituent elements of the display device 100 even though the display device 100 is deformed by being curved or stretched.

The switching transistor 150 including a gate electrode 151, an active layer 152, a source electrode 153, and a drain electrode 154 may be formed on the buffer layer 141. The driving transistor 160 including a gate electrode 161, an active layer 162, a source electrode, and a drain electrode 164 may be formed on the buffer layer 141.

First, the active layer 152 of the switching transistor 150 and the active layer 162 of the driving transistor 160 may be disposed on the buffer layer 141. For example, the active layer 152 of the switching transistor 150 and the active layer 162 of the driving transistor 160 may each be made of an oxide semiconductor. Alternatively, the active layer 152 of the switching transistor 150 and the active layer 162 of the driving transistor 160 may be made of amorphous silicon (a-Si), polycrystalline silicon (poly-Si), an organic semiconductor, or the like.

The gate insulation layer 142 may be disposed on the active layer 152 of the switching transistor 150 and the active layer 162 of the driving transistor 160. The gate insulation layer 142 may electrically insulate the gate electrode 151 of the switching transistor 150 and the active layer 152 of the switching transistor 150 and electrically insulate the gate electrode 161 of the driving transistor 160 and the active layer 162 of the driving transistor 160. The gate insulation layer 142 may include an insulating material. For example, the gate insulation layer 142 may be configured as a single layer made of silicon nitride (SiNx) or silicon oxide (SiOx) that is an inorganic material. Alternatively, the gate insulation layer 142 may be configured as a multilayer made of silicon nitride (SiNx) or silicon oxide (SiOx). However, the present disclosure is not limited thereto.

The gate electrode 151 of the switching transistor 150 and the gate electrode 161 of the driving transistor 160 may be disposed on the gate insulation layer 142. The gate electrode 151 of the switching transistor 150 and the gate electrode 161 of the driving transistor 160 may be disposed on the gate insulation layer 142 and spaced apart from each other. In addition, the gate electrode 151 of the switching transistor 150 may overlap the active layer 152 of the switching transistor 150. The gate electrode 161 of the driving transistor 160 may overlap the active layer 162 of the driving transistor 160.

The gate electrode 151 of the switching transistor 150 and the gate electrode 161 of the driving transistor 160 may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the gate electrode 151 of the switching transistor 150 and the gate electrode 161 of the driving transistor 160 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The first interlayer insulation layer 143 may be disposed on the gate electrode 151 of the switching transistor 150 and the gate electrode 161 of the driving transistor 160. The first interlayer insulation layer 143 may insulate the gate electrode 161 of the driving transistor 160 and an intermediate metal layer IM. Like the buffer layer 141, the first interlayer insulation layer 143 may be made of an inorganic material. For example, the first interlayer insulation layer 143 may be configured as a single layer made of silicon nitride (SiNx) or silicon oxide (SiOx) that is an inorganic material. Alternatively, the first interlayer insulation layer 143 may be configured as a multilayer made of silicon nitride (SiNx) or silicon oxide (SiOx). However, the present disclosure is not limited thereto.

The intermediate metal layer IM may be disposed on the first interlayer insulation layer 143. The intermediate metal layer IM may overlap the gate electrode 161 of the driving transistor 160. Therefore, a capacitor (e.g., storage capacitor) may be formed in an area in which the intermediate metal layer IM and the gate electrode 161 of the driving transistor 160 overlap each other. Specifically, the storage capacitor may be formed by the gate electrode 161 of the driving transistor 160, the first interlayer insulation layer 143, and the intermediate metal layer IM. However, the arrangement area of the intermediate metal layer IM is not limited thereto. Various storage capacitors may be formed as the intermediate metal layer IM overlaps other electrodes.

The intermediate metal layer IM may be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the intermediate metal layer IM may be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The second interlayer insulation layer 144 may be disposed on the intermediate metal layer IM. The second interlayer insulation layer 144 may insulate the gate electrode 151 of the switching transistor 150 and the source electrode 153 and the drain electrode 154 of the switching transistor 150. In addition, the second interlayer insulation layer 144 may insulate the intermediate metal layer IM and the source electrode and the drain electrode 164 of the driving transistor 160. Like the buffer layer 141, the second interlayer insulation layer 144 may be made of an inorganic material. For example, the first interlayer insulation layer 143 may be configured as a single layer made of silicon nitride (SiNx) or silicon oxide (SiOx) that is an inorganic material. Alternatively, the first interlayer insulation layer 143 may be configured as a multilayer made of silicon nitride (SiNx) or silicon oxide (SiOx). However, the present disclosure is not limited thereto.

The source electrode 153 and the drain electrode 154 of the switching transistor 150 may be disposed on the second interlayer insulation layer 144. In addition, the source electrode and the drain electrode 164 of the driving transistor 160 may be disposed on the second interlayer insulation layer 144. The source electrode 153 and the drain electrode 154 of the switching transistor 150 may be disposed on the same layer and spaced apart from each other. In addition, the source electrode of the driving transistor 160 is not illustrated in FIG. 3. The source electrode of the driving transistor 160 may also be disposed on the same layer as the drain electrode 164 and spaced apart from the drain electrode 164. The source electrode 153 and the drain electrode 154 of the switching transistor 150 may be electrically connected to the active layer 152 while adjoining the active layer 152. In addition, the source electrode and the drain electrode 164 of the driving transistor 160 may be electrically connected to the active layer 162 while adjoining the active layer 162. In addition, the drain electrode 154 of the switching transistor 150 may be electrically connected to the gate electrode 161 of the driving transistor 160 while adjoining the gate electrode 161 of the driving transistor 160 through a contact hole.

The source electrode 153 and the drain electrodes 154 and 164 may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the source electrode 153 and the drain electrodes 154 and 164 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

In addition, in the present specification, the driving transistor 160 has been described as having a coplanar structure. However, various transistors having a staggered structure may also be used. In addition, in the present specification, the transistor may have not only a top gate structure but also a bottom gate structure.

A gate pad and a data pad may be disposed on the second interlayer insulation layer 144.

Specifically, the gate pad may be a pad configured to transmit the gate voltages to the plurality of subpixels SPX. The gate pad may be connected to the first connection line 181 through a contact hole. In addition, the gate voltage supplied from the first connection line 181 may be transmitted from the gate pad to the gate electrode 151 of the switching transistor 150 through a line formed on the plate pattern 121.

Further, the data pad DP may be a pad configured to transmit the data voltages to the plurality of subpixels SPX. The data pad DP may be connected to the second connection line 182 through a contact hole. In addition, the data voltage supplied from the second connection line 182 may be transmitted from the data pad DP to the source electrode 153 of the switching transistor 150 through a line formed on the plate pattern 121.

A voltage pad VP may be a pad configured to transmit the high-potential voltages to the plurality of subpixels SPX. The voltage pad VP may be connected to the first connection line 181 through a contact hole. In addition, the high-potential voltage supplied from the first connection line 181 may be transmitted from the voltage pad VP to the driving transistor 160 through a line formed on the plate pattern 121. The high-potential voltage may also be referred to as a second drive voltage. The low-potential voltage to be described below may be referred to as a first drive voltage.

The gate pad, the data pad DP, and the voltage pad VP may be made of the same material as the source electrode 153 and the drain electrodes 154 and 164. However, the present disclosure is not limited thereto.

The passivation layer 145 may be formed on the switching transistor 150 and the driving transistor 160. That is, the passivation layer 145 may be disposed to cover the switching transistor 150 and the driving transistor 160 to protect the switching transistor 150 and the driving transistor 160 from the penetration of moisture and oxygen. The passivation layer 145 may be made of an inorganic material and configured as a single layer or multilayer. However, the present disclosure is not limited thereto.

In addition, the gate insulation layer 142, the first interlayer insulation layer 143, the second interlayer insulation layer 144, and the passivation layer 145 may be patterned and formed only in an area that overlaps the plurality of plate patterns 121. Like the buffer layer 141, the gate insulation layer 142, the first interlayer insulation layer 143, the second interlayer insulation layer 144, and the passivation layer 145 may each be made of an inorganic material. For this reason, the display device 100 may easily crack and be damaged during the process of stretching the display device 100. Therefore, the gate insulation layer 142, the first interlayer insulation layer 143, the second interlayer insulation layer 144, and the passivation layer 145 may be formed only on the upper portions of the plurality of plate patterns 121 by being patterned in the shapes of the plurality of plate patterns 121 without being formed in the area between the plurality of plate patterns 121.

A planarization layer 146 may be formed on the passivation layer 145. The planarization layer 146 may planarize an upper portion of the switching transistor 150 and an upper portion of the driving transistor 160. The planarization layer 146 may be configured as a single layer or a plurality of layers and made of an organic material. Therefore, the planarization layer 146 may be referred to as an organic insulation layer. For example, the planarization layer 146 may be made of an acrylic-based organic material. However, the present disclosure is not limited thereto.

With reference to FIG. 3, the planarization layer 146 may be disposed on the plurality of plate patterns 121 and cover top surfaces and side surfaces of the buffer layer 141, the gate insulation layer 142, the first interlayer insulation layer 143, the second interlayer insulation layer 144, and the passivation layer 145. In addition, the planarization layer 146, together with the plurality of plate patterns 121, may surround the buffer layer 141, the gate insulation layer 142, the first interlayer insulation layer 143, the second interlayer insulation layer 144, and the passivation layer 145. More specifically, the planarization layer 146 may be disposed to partially cover a top surface and side surface of the passivation layer 145, a side surface of the first interlayer insulation layer 143, a side surface of the second interlayer insulation layer 144, a side surface of the gate insulation layer 142, a side surface of the buffer layer 141, and top surfaces of the plurality of plate patterns 121. Therefore, the planarization layer 146 may compensate for level differences between the side surfaces of the buffer layer 141, the gate insulation layer 142, the first interlayer insulation layer 143, the second interlayer insulation layer 144, and the passivation layer 145. Further, the planarization layer 146 may increase bonding strength with the plurality of connection lines 181 and 182 disposed on the side surface of the planarization layer 146.

With reference to FIG. 3, an inclination angle of the side surface of the planarization layer 146 may be smaller than inclination angles defined between the side surfaces of the buffer layer 141, the gate insulation layer 142, the first interlayer insulation layer 143, the second interlayer insulation layer 144, and the passivation layer 145. For example, the side surface of the planarization layer 146 may have an inclination more gradual than inclinations defined between the side surface of the passivation layer 145, the side surface of the first interlayer insulation layer 143, the side surface of the second interlayer insulation layer 144, the side surface of the gate insulation layer 142, and the side surface of the buffer layer 141. Therefore, the plurality of connection lines 181 and 182 disposed to adjoin the side surface of the planarization layer 146 is disposed to have a gradual inclination, such that stress applied to the plurality of connection lines 181 and 182 may be reduced when the display device 100 is stretched. Further, the side surface of the planarization layer 146 may have a relatively gradual inclination, thereby inhibiting the plurality of connection lines 181 and 182 from cracking or separating from the side surface of the planarization layer 146.

With reference to FIGS. 2 and 3, the plurality of connection lines 181 and 182 means lines that electrically connect the pads on the plurality of plate patterns 121. The plurality of connection lines 181 and 182 may be disposed on the plurality of line patterns 122. In addition, the line pattern 122 is not disposed in an area in which the plurality of connection lines 181 and 182 is not disposed among the areas between the plurality of plate patterns 121.

The plurality of connection lines 181 and 182 may include the first connection line 181 and the second connection line 182. The first connection line 181 and the second connection line 182 may be disposed between the plurality of plate patterns 121. Specifically, the first connection line 181, among the plurality of connection lines 181 and 182, may mean a line disposed between the plurality of plate patterns 121 and extending in the first direction X. The second connection line 182, among the plurality of connection lines 181 and 182, may mean a line disposed between the plurality of plate patterns 121 and extending in the second direction Y.

The plurality of connection lines 181 and 182 may each be configured as a layered structure made of a metallic material such as copper (Cu), aluminum (Al), titanium (Ti), or molybdenum (Mo) or a metallic material such as copper/molybdenum-titanium (Cu/Moti) or titanium/aluminum/titanium (Ti/Al/Ti). However, the present disclosure is not limited thereto.

In the case of a general display panel of a display device, various lines such as a plurality of gate lines and a plurality of data lines are disposed between a plurality of subpixels and extend in straight shapes. The plurality of subpixels is connected to the single signal line. Therefore, in the case of the general display panel of the display device, various lines such as the gate line, the data line, the high-potential voltage line, and the reference voltage line may extend in a direction from one side to the other side of the display panel of the organic light-emitting display device without interruption on the substrate.

In contrast, in the case of the display device 100 according to the exemplary embodiment of the present disclosure, various lines such as gate lines, data lines, high-potential voltage lines, reference voltage lines, and initialization voltage lines, which are straight lines that may be considered as being used for the general display panel of the display device, may be disposed only on the plurality of plate patterns 121. That is, in the display device 100 according to the exemplary embodiment of the present disclosure, the straight line may be disposed only on the plurality of plate patterns 121.

In the display device 100 according to the exemplary embodiment of the present disclosure, the pads on the two adjacent plate patterns 121 may be connected by the plurality of connection lines 181 and 182. Therefore, the plurality of connection lines 181 and 182 may electrically connect the gate pads, the data pads DP, or the voltage pads VP on the two adjacent plate patterns 121. Therefore, the display device 100 according to the exemplary embodiment of the present disclosure may include the plurality of connection lines 181 and 182 to electrically connect various lines such as the gate lines, the data lines, the high-potential voltage lines, and the reference voltage lines between the plurality of plate patterns 121. For example, the gate line may be disposed on the plurality of plate patterns 121 disposed adjacent to one another in the first direction X, and the gate pads may be disposed at two opposite ends of the gate line. In this case, the plurality of gate pads on the plurality of plate patterns 121 disposed adjacent to one another in the first direction X may be connected to one another by the first connection line 181 that serves as a gate line. Therefore, the gate line disposed on the plurality of plate patterns 121 and the first connection line 181 disposed on the line pattern 122 may serve as a single gate line. The gate line may be referred to as a scan signal line. In addition, among all the various lines that may be included in the display device 100, the line extending in the first direction X, for example, the light-emitting signal line and the high-potential voltage line may also be electrically connected by the first connection line 181, as described above.

With reference to FIGS. 2 and 3, the first connection line 181 may connect the voltage pads VP on the two plate patterns 121 disposed side by side, among the voltage pads VP on the plurality of plate patterns 121 disposed adjacent to one another in the first direction X. The first connection line 181 may serve as the scan signal line and the light-emitting signal line that are the gate lines. However, the present disclosure is not limited thereto. The voltage pads VP on the plurality of plate patterns 121 disposed in the first direction X may be connected by the first connection line 181 that serves as the high-potential voltage line, such that the single high-potential voltage may be transmitted.

In addition, the second connection line 182 may connect the data pads DP on the two plate patterns 121 disposed side by side, among the data pads DP on the plurality of plate patterns 121 disposed adjacent to one another in the second direction Y. The second connection line 182 may serve as the data line or the reference voltage line. However, the present disclosure is not limited thereto. Internal lines on the plurality of plate patterns 121 disposed in the second direction Y may be connected by the plurality of second connection lines 182 that serves as the data lines, such that the single data voltage may be transmitted.

As illustrated in FIG. 3, the first connection line 181 may be disposed to adjoin the top surface and the side surface of the planarization layer 146 disposed on the plate pattern 121. Further, the first connection line 181 may extend to the top surface of the line pattern 122. In addition, the second connection line 182 may be disposed to adjoin the top surface and the side surface of the planarization layer 146 disposed on the plate pattern 121. Further, the second connection line 182 may extend to the top surface of the line pattern 122.

However, because a rigid pattern need not be disposed in the area in which the first connection line 181 and the second connection line 182 are not disposed, the line pattern 122, which is a rigid pattern, is not disposed on a lower portion of the first connection line 181 and a lower portion of the second connection line 182.

Meanwhile, with reference to FIG. 3, a bank 147 may be formed on a connection pad CNT, the plurality of connection lines 181 and 182, and the planarization layer 146. The bank 147 may separate the adjacent subpixels SPX. The bank 147 may be disposed to at least partially cover the connection pad CNT, the plurality of connection lines 181 and 182, and the planarization layer 146. The bank 147 may be made of an insulating material. In addition, the bank 147 may include a black material. Because the bank 147 includes a black material, the bank 147 serves to cover the lines that may be visually recognized through the display area AA. For example, the bank 147 may be made of a carbon-based mixture. For example, the bank 147 may include carbon black. However, the present disclosure is not limited thereto. The bank 147 may be made of a transparent insulating material. Further, FIG. 1 illustrates that a height of the bank 147 is lower than a height of the light-emitting element 170.

However, the present disclosure is not limited thereto. The height of the bank 147 may be equal to the height of the light-emitting element 170.

With reference to FIG. 3, the light-emitting element 170 may be disposed on a first connection pad CNT1 and a second connection pad CNT2. The light-emitting element 170 may include an n-type layer 171, an active layer 172, a p-type layer 173, an n-electrode 174, and a p-electrode 175. The light-emitting element 170 of the display device 100 according to the exemplary embodiment of the present disclosure may have a flip-chip structure having the n-electrode 174 and the p-electrode 175 formed on one surface thereof.

The n-type layer 171 may be formed by injecting n-type impurities into gallium nitride (GaN) having excellent crystallinity. The n-type layer 171 may also be disposed on a separate base substrate made of a material capable of emitting light.

The active layer 172 may be disposed on the n-type layer 171. The active layer 172 may be a light-emitting layer provided in the light-emitting element 170 and configured to emit light. The active layer 172 may be made of a nitride semiconductor, e.g., indium gallium nitride (InGaN). The p-type layer 173 may be disposed on the active layer 172. The p-type layer 173 may be formed by injecting p-type impurities into gallium nitride (GaN).

The light-emitting element 170 according to the exemplary embodiment of the present disclosure may be manufactured by sequentially stacking the n-type layer 171, the active layer 172, and the p-type layer 173 as described above, etching a predetermined portion, and then forming the n-electrode 174 and the p-electrode 175. In this case, the predetermined portion may be a space for spacing the n-electrode 174 and the p-electrode 175. The predetermined portion may be etched so that a part of the n-type layer 171 is exposed. In other words, a surface of the light-emitting element 170, on which the n-electrode 174 and the p-electrode 175 are to be disposed, may be a surface having different height levels in terms of a planarized surface.

The n-electrode 174 may be disposed in the area etched as described above. The n-electrode 174 may be made of an electrically conductive material. In addition, the p-electrode 175 may be disposed in a non-etched area. The p-electrode 175 may also be made of an electrically conductive material. For example, the n-electrode 174 may be disposed on the n-type layer 171 exposed by the etching process, and the p-electrode 175 may be disposed on the p-type layer 173. The p-electrode 175 may be made of the same material as the n-electrode 174.

A bonding layer AD is disposed on a top surface of the first connection pad CNT1 and a top surface of the second connection pad CNT2 and disposed between the first connection pad CNT1 and the second connection pad CNT2, such that the light-emitting element 170 may be bonded onto the first connection pad CNT1 and the second connection pad CNT2. In this case, the n-electrode 174 may be disposed on the first connection pad CNT1, and the p-electrode 175 may be disposed on the second connection pad CNT2.

The bonding layer AD may be a conductive bonding layer made by dispersing conductive balls into an insulating base member. Therefore, in case that heat or pressure is applied to the bonding layer AD, the conductive balls are electrically connected in a portion to which heat or pressure is applied, such that the bonding layer AD has conductive properties. An area, which is not pressed, may have insulation properties. For example, the n-electrode 174 may be electrically connected to the first connection pad CNT1 by means of the bonding layer AD. The p-electrode 175 may be electrically connected to the second connection pad CNT2 by means of the bonding layer AD. The second connection pad CNT2, the p-electrode 175, the first connection pad CNT1, the n-electrode 174 may be electrically connected by applying the bonding layer AD onto the first connection pad CNT1 and the second connection pad CNT2 in an inkjet manner or the like, transferring the light-emitting element 170 onto the bonding layer AD, and pressing and heating the light-emitting element 170. However, the other portions of the bonding layer AD, except for a portion of the bonding layer AD disposed between the n-electrode 174 and the first connection pad CNT1 and a portion of the bonding layer AD disposed between the p-electrode 175 and the second connection pad CNT2, may have insulation properties. Meanwhile, the bonding layers AD, which are provided as separated layers, may be respectively disposed on the first connection pad CNT1 and the second connection pad CNT2.

Further, the first connection pad CNT1 may be connected to any one of the plurality of first connection lines 181 and receive the low-potential voltage, which is used to operate the light-emitting element 170, from the power supply PS.

Further, the second connection pad CNT2 may be electrically connected to the drain electrode 164 of the driving transistor 160 and receive the drive voltage, which is used to operate the light-emitting element 170, from the driving transistor 160. Meanwhile, FIG. 3 illustrates that the second connection pad CNT2 and the drain electrode 164 of the driving transistor 160 are connected indirectly without being in direct contact with each other. However, the exemplary embodiment of the present disclosure is not limited thereto. The second connection pad CNT2 and the drain electrode 164 of the driving transistor 160 may be in direct contact with each other.

Therefore, when the display device 100 is turned on, the voltage with different levels respectively applied to the first connection pad CNT1 and the second connection pad CNT2 may be respectively transmitted to the n-electrode 174 and the p-electrode 175, such that the light-emitting element 170 may emit light.

In addition, with reference to FIG. 3, the filling layer 190 may be disposed on the front surface of the lower substrate 111 and fill portions between the constituent elements disposed on the upper substrate 112 and the lower substrate 111. The filling layer 190 may be made of a curable bonding agent. Specifically, the filling layer 190 may be formed by coating the front surface of the lower substrate 111 with a material, which constitutes the filling layer 190, and curing the material. The filling layer 190 may be disposed between the constituent elements disposed on the upper substrate 112 and the lower substrate 111. For example, the filling layer 190 may be an optically clear adhesive (OCA) and made of an acrylic-based bonding agent, a silicon-based bonding agent, a urethane-based bonding agent, and the like.

Plurality of Conductive Patterns

Figure 4B:
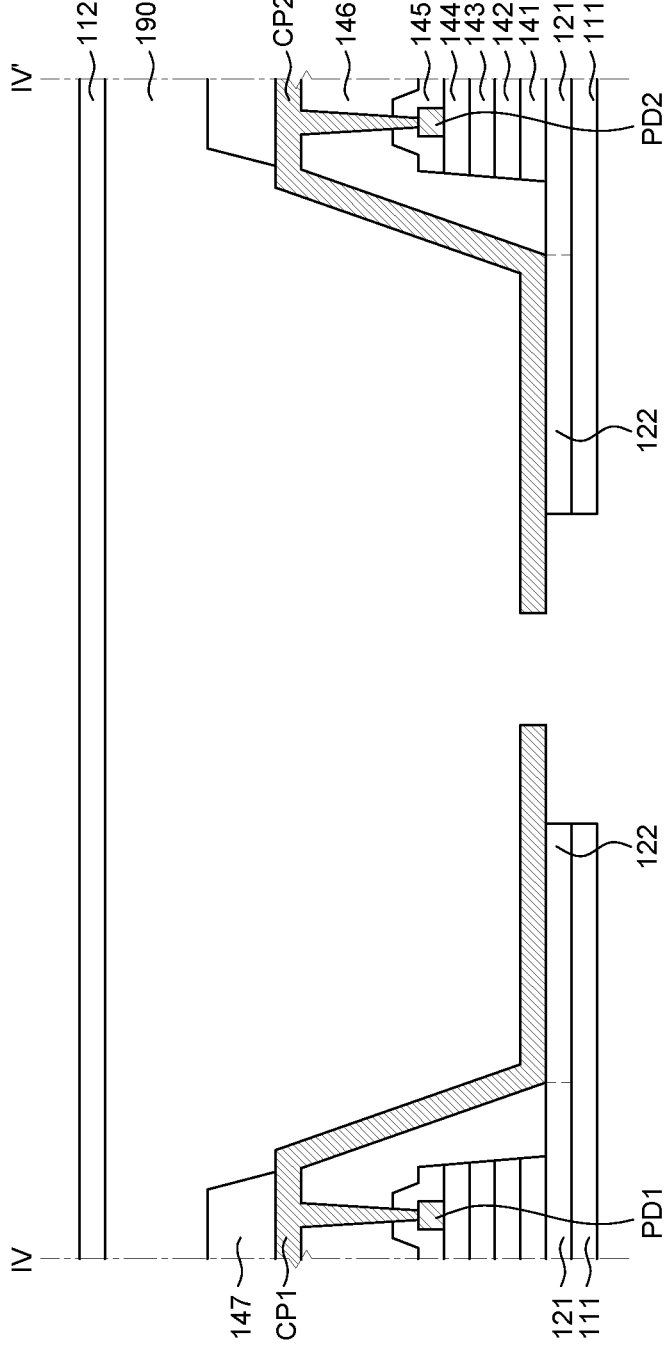

FIGS. 4A and 4B are cross-sectional views taken along cutting line IV-IV' illustrated in FIG. 2.

With reference to FIGS. 2 and 4A, the plurality of conductive patterns may include a first conductive pattern CP1 and a second conductive pattern CP2.

Further, the first conductive pattern CP1 may be disposed to adjoin the top surface and the side surface of the planarization layer 146 disposed on the plate pattern 121. Further, the first conductive pattern CP1 may extend to the top surface of the line pattern 122.

Further, the first conductive pattern CP1 may be connected to a first pad PD1 through a contact hole. However, the present disclosure is not limited thereto. The first conductive pattern CP1 may be connected to any one of the plurality of first connection lines 181.

Therefore, a first voltage, which is a drive voltage for the light-emitting element, may be applied to the first conductive pattern CP1.

Further, the second conductive pattern CP2 may be disposed to adjoin the top surface and the side surface of the planarization layer 146 disposed on the plate pattern 121. Further, the second conductive pattern CP2 may extend to the top surface of the line pattern 122.

Further, the second conductive pattern CP2 may be connected to a second pad PD2 through a contact hole. However, the present disclosure is not limited thereto. The second conductive pattern CP2 may be connected to any one of the plurality of second connection lines 182.

Therefore, a second voltage, which is different from the first voltage, may be applied to the second conductive pattern CP2. The second voltage may be various voltages such as a gate voltage, a data voltage, a high-potential voltage, a reference voltage, and an initialization voltage.

Further, with reference to FIG. 2, the first conductive pattern CP1 and the second conductive pattern CP2 may be disposed symmetrically based on a center of the first area A1.

More specifically, the first conductive pattern CP1 may extend in a direction of a left lower end from the first area A1, and the second conductive pattern CP2 may extend in a direction of a right upper end from the first area A1.

Further, the plurality of first conductive patterns CP1 and the plurality of second conductive patterns CP2 may each be configured as a layered structure made of a metallic material such as copper (Cu), aluminum (Al), titanium (Ti), or molybdenum (Mo) or a metallic material such as copper/molybdenum-titanium (Cu/Moti) or titanium/aluminum/titanium (Ti/Al/Ti). However, the present disclosure is not limited thereto. Further, the plurality of first conductive patterns CP1 and the plurality of second conductive patterns CP2 may be integrated.

Further, the first conductive pattern CP1 and the second conductive pattern CP2 may each include a plurality of first parts extending in the second direction Y, and at least one second part that connects the first parts.

Specifically, with reference to FIGS. 2 and 4A, the first conductive pattern CP1 may include a first part extending in the negative second direction Y from the first pad PD1, a second part extending in the positive first direction X from the first part, and another first part extending in the positive second direction Y from the second part.

Further, the second conductive pattern CP2 may include a first part extending in the positive second direction Y from the second pad PD2, a second part extending in the negative first direction X from the first part, and another first part extending in the negative second direction Y from the second part.

Further, the first conductive pattern CP1 and the second conductive pattern CP2 may be intertwined.

That is, another first part of the first conductive pattern CP1, which extends in the positive second direction Y, and another first part of the second conductive pattern CP2, which extends in the negative second direction Y, may overlap each other in the first direction X.

Further, the second part of the second conductive pattern CP2, which extends in the positive first direction X, and the second part of the second conductive pattern CP2, which extends in the negative first direction X, may overlap each other in the second direction Y.

Therefore, because the first conductive pattern CP1 and the second conductive pattern CP2 are disposed in the above-mentioned shape, the first conductive pattern CP1 and the second conductive pattern CP2 may are in contact with each other when the display device is stretched in the first direction X and the second direction Y.

With reference to FIG. 4B, in several exemplary embodiments, the lower substrate 111 and the line pattern 122, which correspond to the first conductive pattern CP1 and the second conductive pattern CP2, may be at least partially removed so that the first conductive pattern CP1 and the second conductive pattern CP2 are in contact with each other. A partial section of the first conductive pattern CP1 and a partial section of the second conductive pattern CP2 are in floating states as described above, such that the first conductive pattern CP1 and the second conductive pattern CP2 may are in contact with each other when the display device is stretched to a predetermined degree or more in a situation in which the display device is stretched in the first direction X and the second direction Y.

FIG. 4B illustrates that both the lower substrate 111 and the line pattern 122, which correspond to the first conductive pattern CP1 and the second conductive pattern CP2, are at least partially removed. However, the present disclosure is not limited thereto. At least one of the lower substrate 111 and the line pattern 122 may be removed.

Hereinafter, an operation of stretching the display device of the present disclosure will be described with reference to FIGS. 5A to 6B.

Operation of Stretching Display Device

Figure 5A:
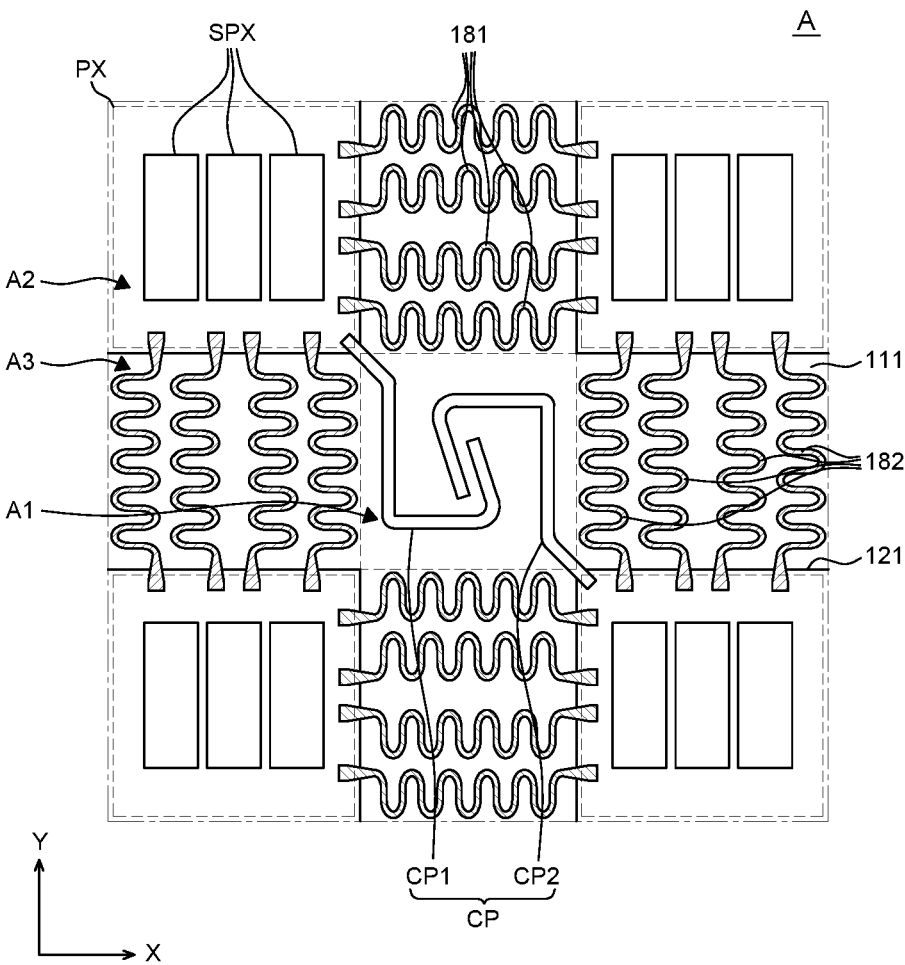
FIGS. 5A, 5B and 5C are views for explaining an operation of extending the display device according to the exemplary embodiment of the present disclosure in a second direction.
Figure 5B:
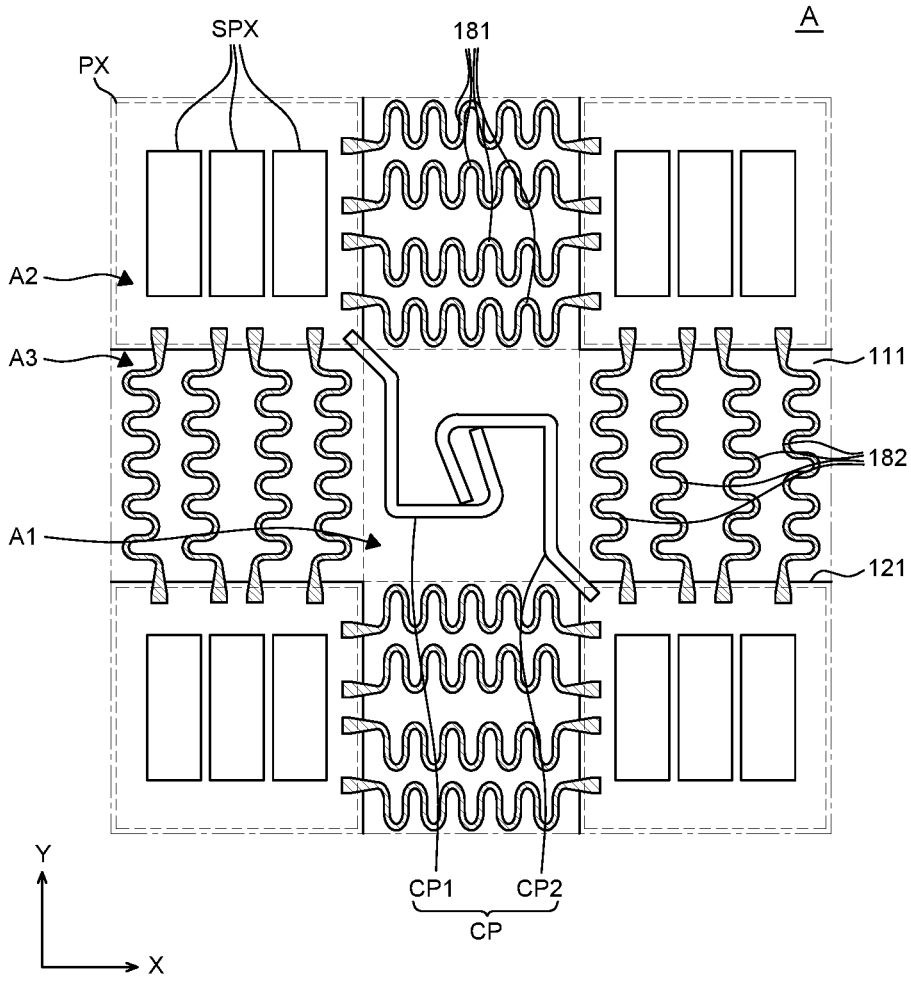
Figure 5C:
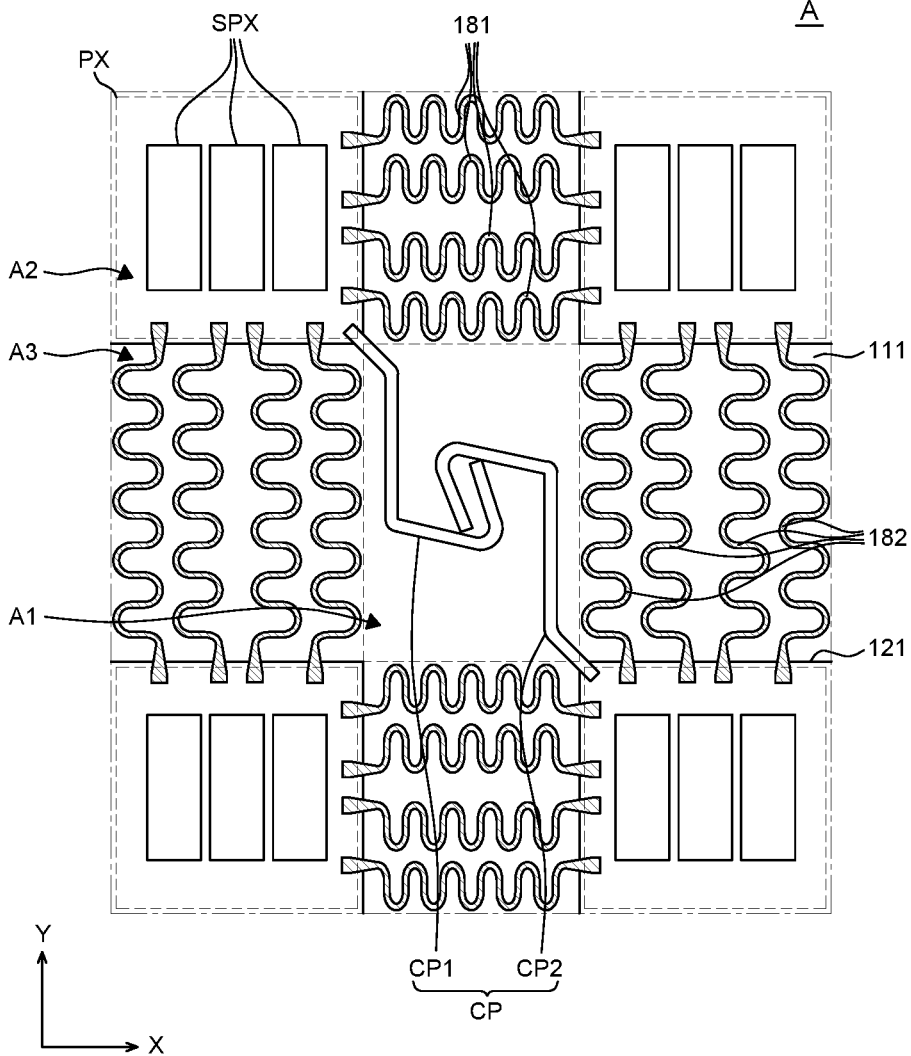

FIGS. 5A to 5C are views for explaining an operation of extending the display device according to the exemplary embodiment of the present disclosure in the second direction Y.

Figure 6A:
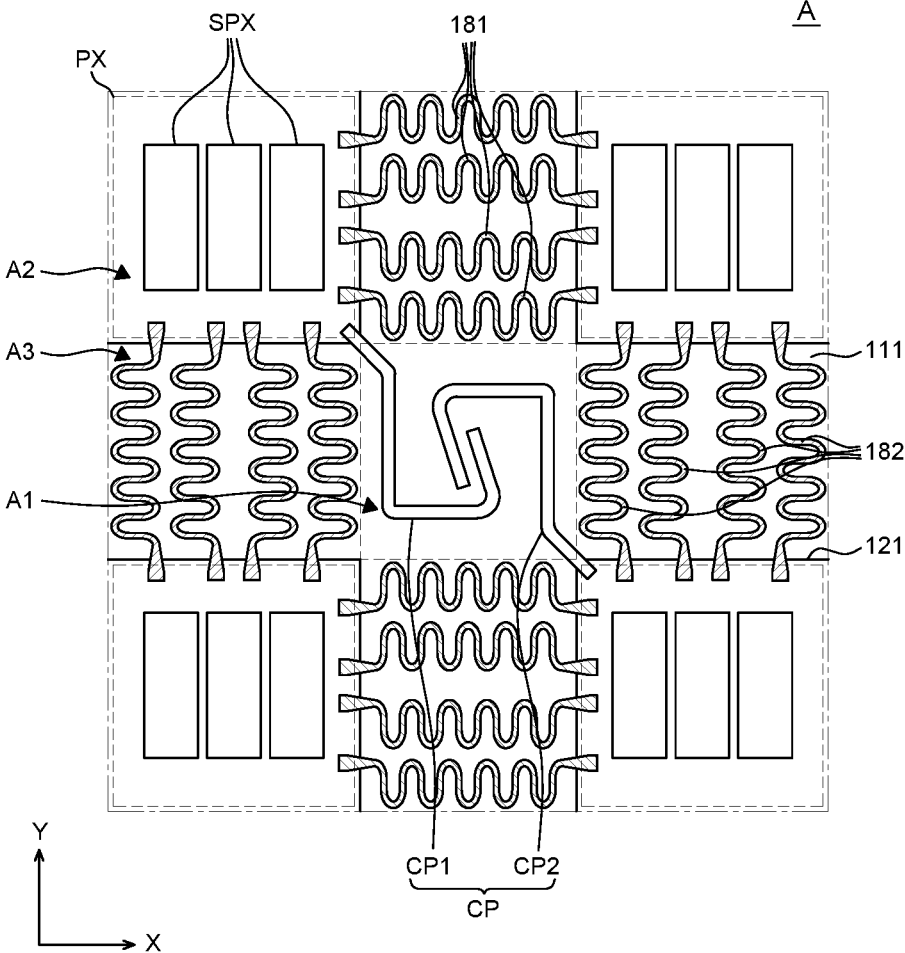
FIGS. 6A, 6B and 6C are views for explaining an operation of extending the display device according to the exemplary embodiment of the present disclosure in a first direction.
Figure 6B:
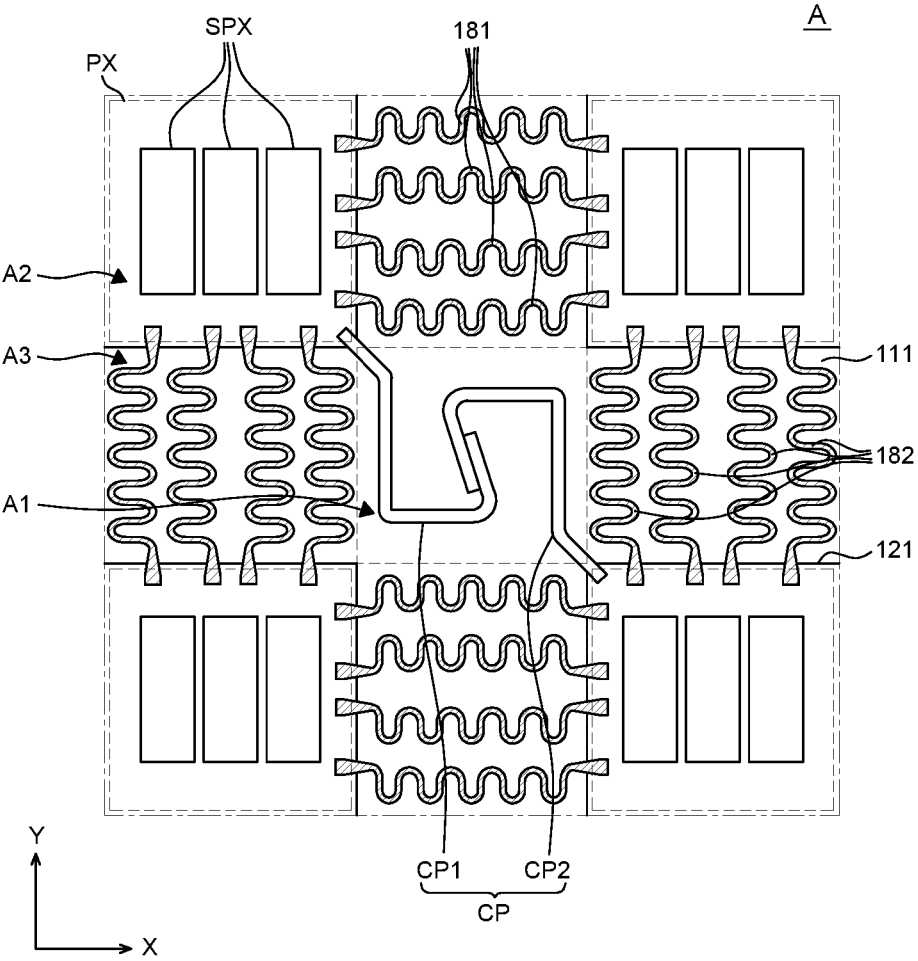
Figure 6C:
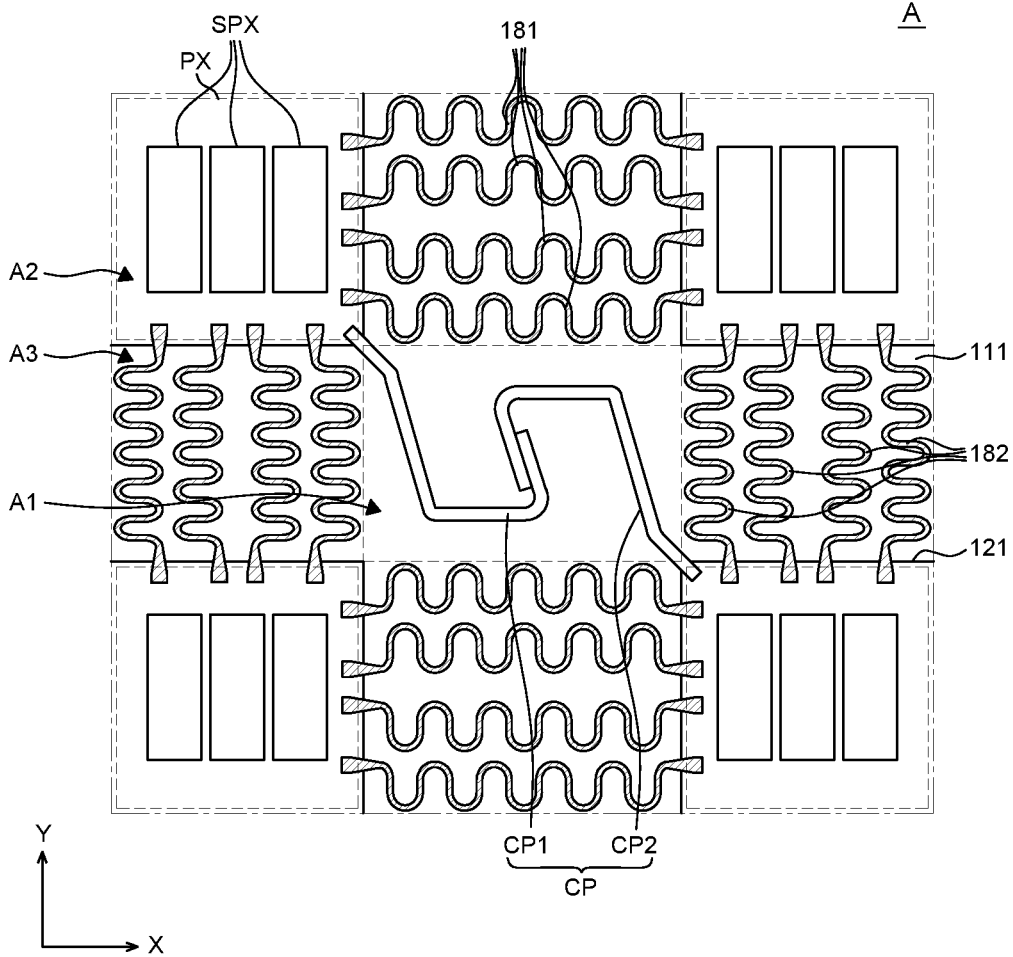

FIGS. 6A to 6C are views for explaining an operation of extending the display device according to the exemplary embodiment of the present disclosure in the first direction X.

Specifically, FIGS. 5A and 6A are enlarged views of the display device in case that the display device is not stretched or the display device is stretched within an allowable range.

FIGS. 5B and 6B are enlarged views of the display device at a time point at which the display device is excessively stretched out of the allowable range.

FIGS. 5C and 6C are enlarged views of the display device after the time point at which the display device is excessively stretched out of the allowable range.

With reference to FIGS. 5A and 6A, the first conductive pattern CP1 and the second conductive pattern CP2 are not in contact with each other in case that the display device is not stretched or the display device is stretched within the allowable range.

That is, the first conductive pattern CP1 and the second conductive pattern CP2 are spaced apart from each other in case that the display device is not stretched or the display device is stretched within the allowable range.

Therefore, the plurality of light-emitting elements 170 receives the low-potential voltage from the first connection pad CNT1 and receives the drive voltage from the second connection pad CNT2, such that the light-emitting elements 170 may normally emit light.

That is, a normal image may be implemented in case that the display device is not stretched or the display device is stretched within the allowable range.

On the contrary, with reference to FIGS. 5B and 6B, the first conductive pattern CP1 and the second conductive pattern CP2 may are in contact with each other and be electrically connected to each other at the time point at which the display device is excessively stretched out of the allowable range.

Further, with reference to FIGS. 5C and 6C, after the time point at which the display device is excessively stretched out of the allowable range, the first conductive pattern CP1 and the second conductive pattern CP2 may engage with each other, and the first conductive pattern CP1 and the second conductive pattern CP2 may be deformed.

However, as described above, the first voltage, which is the drive voltage for the light-emitting element 170, is applied to the first conductive pattern CP1, and the second voltage, which is different from the first voltage, is applied to the second conductive pattern CP2.

However, in case that the display device is excessively stretched out of the allowable range, the first conductive pattern CP1 and the second conductive pattern CP2 may be electrically connected, such that the first voltage applied to the first connection pad CNT2 may be changed to the second voltage.

Therefore, because the low-potential voltage applied to the light-emitting element 170 is changed, the light-emitting element 170 may not operate normally, or the light-emitting element 170 may not emit light. That is, in case that the display device is excessively stretched, the light-emitting element 170 may not emit light, or the light-emitting element 170 may operate abnormally.

Therefore, a user may recognize that the display device is excessively stretched out of the allowable range, and the user may stop the operation of stretching the display device and restore the display device to a non-stretched state.

Therefore, in case that the display device is restored to the non-stretched state, the first conductive pattern CP1 and the second conductive pattern CP2 may be spaced apart from each other, and the plurality of light-emitting elements 170 may receive the low-potential voltage from the first connection pad CNT1, such that the light-emitting elements 170 may normally emit light.

As a result, the display device according to the exemplary embodiment of the present disclosure may not be excessively stretched out of the allowable range, thereby ensuring reliability related to the repeated operations of stretching the display device.

Hereinafter, a display device according to another exemplary embodiment of the present disclosure will be specifically described. The display device of another exemplary embodiment of the present disclosure and the display device according to the exemplary embodiment of the present disclosure differ from each other only in terms of the shapes of the plurality of conductive patterns. Therefore, the description will be focused on the shapes of the plurality of conductive patterns. Further, the same reference numerals are used for the identical components in the display device of another exemplary embodiment of the present disclosure and the display device according to the exemplary embodiment of the present disclosure.

Another Exemplary Embodiment of Present Disclosure

Figure 7:
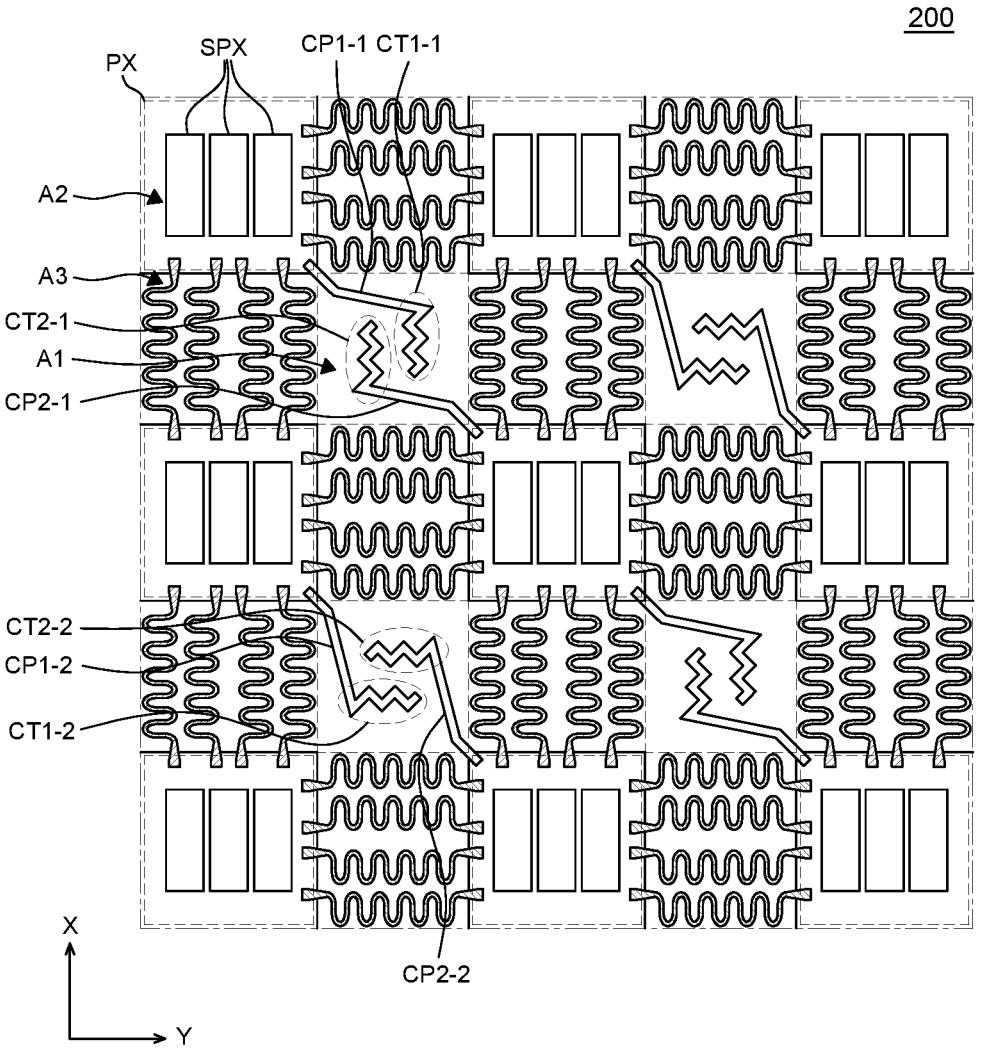
FIG. 7 is an enlarged top plan view of a display device according to another exemplary embodiment of the present disclosure.

FIG. 7 is an enlarged top plan view of a display device according to another exemplary embodiment of the present disclosure.

With reference to FIG. 7, in a display device 200 according to another exemplary embodiment of the present disclosure, a plurality of conductive patterns may include first conductive patterns CP1-1 and CP1-2 and second conductive patterns CP2-1 and CP2-2 that are different types.

That is, any one CP1-2 of the plurality of first conductive patterns CP1-1 and CP1-2 and any one CP2-2 of the plurality of second conductive patterns CP2-1 and CP2-2, which are disposed in any one of the plurality of first areas A1, may respectively include contact parts CT1-2 and CT2-2 extending in the first direction X.

For example, among the four first areas A1 illustrated in FIG. 7, the first conductive pattern CP1-2 and the second conductive pattern CP2-2, which are disposed in the first area A1 positioned at the right upper end and the first area A1 positioned at the left lower end, may include the contact parts CT1-2 and CT2-2 extending in the first direction X.

Further, the contact part CT1-2 of any one CP1-2 of the plurality of first conductive patterns CP1-1 and CP1-2 and the contact part CT2-2 of any one CP2-2 of the plurality of second conductive patterns CP2-1 and CP2-2 are spaced apart from each other while overlapping each other in the second direction Y.

Therefore, in case that the display device is excessively stretched in the second direction Y, the contact part CT1-2 of any one CP1-2 of the plurality of first conductive patterns CP1-1 and CP1-2 and the contact part CT2-2 of any one CP2-2 of the plurality of second conductive patterns CP2-1 and CP2-2 may are in contact with each other.

Further, another CP1-1 of the plurality of first conductive patterns CP1-1 and CP1-2 and another CP2-1 of the plurality of second conductive patterns CP2-1 and CP2-2, which are disposed in another of the plurality of first areas A1, may respectively include contact parts CT1-1 and CT2-1 extending in the second direction Y.

For example, among the four first areas A1 illustrated in FIG. 7, the first conductive pattern CP1-1 and the second conductive pattern CP2-1, which are disposed in the first area A1 positioned at the right lower end and the first area A1 positioned at the left upper end, may include the contact parts CT1-1 and CT2-1 extending in the second direction Y.

Further, the contact part CT1-1 of another CP1-1 of the plurality of first conductive patterns CP1-1 and CP1-2 and the contact part CT2-1 of another CP2-1 of the plurality of second conductive patterns CP2-1 and CP2-2 are spaced apart from each other while overlapping each other in the first direction X.

Therefore, in case that the display device is excessively stretched in the first direction X, the contact part CT1-1 of another CP1-1 of the plurality of first conductive patterns CP1-1 and CP1-2 and the contact part CT2-1 of another CP2-1 of the plurality of second conductive patterns CP2-1 and CP2-2 may are in contact with each other.

FIG. 7 illustrates that the contact parts of the first conductive patterns CP1-1 and CP1-2 and the contact parts of the second conductive patterns CP2-1 and CP2-2 each have a zigzag shape. However, the present disclosure is not limited thereto. The shapes may be variously changed.

Further, with reference to FIG. 7, the first conductive patterns CP1-1 and CP1-2 and the second conductive patterns CP2-1 and CP2-2 may be disposed symmetrically based on the center of the first area A1.

More specifically, the first conductive patterns CP1-1 and CP1-2 may extend in the direction of the right lower end from the first area A1, and the second conductive patterns CP2-1 and CP2-2 may extend in the direction of the left upper end from the first area A1.

Further, the plurality of first conductive patterns CP1-1 and CP1-2 and the plurality of second conductive patterns CP2-1 and CP2-2 may each be configured as a layered structure made of a metallic material such as copper (Cu), aluminum (Al), titanium (Ti), or molybdenum (Mo) or a metallic material such as copper/molybdenum-titanium (Cu/Moti) or titanium/aluminum/titanium (Ti/Al/Ti). However, the present disclosure is not limited thereto. Further, the plurality of first conductive patterns CP1-1 and CP1-2 and the plurality of second conductive patterns CP2-1 and CP2-2 may be integrated.

Meanwhile, the first voltage, which is the drive voltage for the light-emitting element, may be applied to the first conductive patterns CP1-1 and CP1-2.

Further, the second voltage, which is different from the first voltage, may be applied to the second conductive patterns CP2-1 and CP2-2. The second voltage may be various voltages such as a gate voltage, a data voltage, a high-potential voltage, a reference voltage, and an initialization voltage.

That is, as described above, in the display device 200 according to another exemplary embodiment of the present disclosure, the first conductive patterns CP1-1 and CP1-2 and the second conductive patterns CP2-1 and CP2-2 are disposed in the above-mentioned shape. Therefore, the first conductive patterns CP1-1 and CP1-2 and the second conductive patterns CP2-1 and CP2-2 may be in contact with one another when the display device is stretched in the first direction X and the second direction Y.

In case that the display device is excessively stretched out of the allowable range in the first direction X or the second direction Y, the first conductive patterns CP1-1 and CP1-2 and the second conductive patterns CP2-1 and CP2-2 may be electrically connected to one another, such that the first voltage may be changed to the second voltage.

Therefore, because the low-potential voltage applied to the light-emitting element is changed, the light-emitting element 170 may not operate normally, or the light-emitting element 170 may not emit light. That is, in case that the display device is excessively stretched, the light-emitting element may not emit light, or the light-emitting element may operate abnormally.

Therefore, the user may recognize that the display device is excessively stretched out of the allowable range, and the user may stop the operation of stretching the display device and restore the display device to a non-stretched state.

Therefore, in case that the display device is restored to the non-stretched state, the first conductive patterns CP1-1 and CP1-2 and the second conductive patterns CP2-1 and CP2-2 may be spaced apart from one another, and the plurality of light-emitting elements may receive the low-potential voltages again, such that the light-emitting elements may normally emit light.

As a result, the display device according to another exemplary embodiment of the present disclosure may not be excessively stretched out of the allowable range, thereby ensuring reliability related to the repeated operations of stretching the display device.

The exemplary embodiments of the present disclosure can also be described as follows:

According to an aspect of the present disclosure, a display device includes: a lower substrate which is stretchable and divided into a first area, a second area, and a third area; a plurality of conductive patterns disposed in the first area of the lower substrate; a plurality of pixels disposed in the second area of the lower substrate; and a plurality of connection lines disposed in the third area of the lower substrate and respectively connected to the plurality of pixels, in which the plurality of conductive patterns is disposed on the same layer and includes first conductive pattern and second conductive pattern spaced apart from each other, thereby suppressing excessive stretching of the display device.

Each of the plurality of pixels may comprise a light-emitting element, and the first conductive pattern may be electrically connected to the light-emitting element.

A first voltage, which is a drive voltage for the light-emitting element, may be applied to the first conductive pattern, and a second voltage, which may be different from the first voltage, is applied to the second conductive pattern.

The first conductive pattern and second conductive pattern may are in contact with each other when the display device is excessively stretched.

The light-emitting element may not emit light or operate abnormally when the display device is excessively stretched.

The first conductive pattern and second conductive pattern may be disposed symmetrically based on a center of the first area.

The first conductive pattern and second conductive pattern each may comprise a plurality of first parts extending in a second direction; and at least one second part configured to connect the first parts and extending in a first direction.

The first conductive pattern and second conductive pattern may be intertwined.

Any one of the plurality of first conductive patterns and any one of the plurality of second conductive patterns respectively may comprises contact parts extending in a first direction, and another of the plurality of first conductive patterns and another of the plurality of second conductive patterns respectively comprise contact parts extending in a second direction.

The contact part of any one of the plurality of first conductive patterns and the contact part of any one of the plurality of second conductive patterns may be spaced apart from each other while overlapping each other in the second direction.

The contact part of any one of the plurality of first conductive patterns and the contact part of any one of the plurality of second conductive patterns may are in contact with each other when the display device is excessively stretched in the first direction.

The contact part of another of the plurality of first conductive patterns and the contact part of another of the plurality of second conductive patterns may be spaced apart from each other while overlapping each other in the first direction.

The contact part of another of the plurality of first conductive patterns and the contact part of another of the plurality of second conductive patterns may are in contact with each other when the display device is excessively stretched in the second direction.

A plurality of plate patterns is formed between the lower substrate and the plurality of pixels, a plurality of line patterns may be formed between the lower substrate, the plurality of connection lines, and the plurality of conductive patterns, and the plurality of plate patterns and the plurality of line patterns each have an elastic modulus higher than an elastic modulus of the lower substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a lower substrate which is stretchable and having a first area, a second area, and a third area;
a plurality of conductive patterns disposed in the first area of the lower substrate;
a plurality of pixels disposed in the second area of the lower substrate; and
a plurality of connection lines disposed in the third area of the lower substrate and respectively coupled to the plurality of pixels,
wherein the plurality of conductive patterns comprises first conductive pattern and second conductive pattern spaced apart from each other, the first conductive pattern and the second conductive pattern being disposed on a same layer,
wherein one end of each of the plurality of conductive patterns is electrically connected to a pixel, and the other end of the plurality of conductive patterns is not connected to any pixel,
wherein a plurality of line patterns is between the lower substrate, the plurality of connection lines, and the plurality of conductive patterns, and
wherein the plurality of line patterns each have a curved shape.

2. The display device of claim 1, wherein each of the plurality of pixels comprises a light-emitting element, and
wherein the first conductive pattern is electrically connected to the light-emitting element.

3. The display device of claim 2, wherein, in operation, the first conductive pattern receives a first voltage, which is a drive voltage for the light-emitting element, and the second conductive pattern receives a second voltage, which is different from the first voltage.

4. The display device of claim 3, wherein the first conductive pattern and second conductive pattern are in contact with each other when the display device is excessively stretched.

5. The display device of claim 4, wherein the light-emitting element does not emit light or operates abnormally when the display device is excessively stretched.

6. The display device of claim 1, wherein the first conductive pattern and second conductive pattern are disposed symmetrically with respect to a center of the first area.

7. The display device of claim 6, wherein the first conductive pattern and second conductive pattern each comprise:

a plurality of first parts extending in a second direction; and at least one second part configured to couple the first parts and extending in a first direction.

8. The display device of claim 6, wherein the first conductive pattern and second conductive pattern are intertwined.

9. The display device of claim 1, wherein any one of the plurality of first conductive patterns and any one of the plurality of second conductive patterns respectively comprise contact parts extending in a first direction, and another of the plurality of first conductive patterns and another of the plurality of second conductive patterns respectively comprise contact parts extending in a second direction.

10. The display device of claim 9, wherein the contact part of any one of the plurality of first conductive patterns and the contact part of any one of the plurality of second conductive patterns are spaced apart from each other while overlapping each other in the second direction.

11. The display device of claim 10, wherein the contact part of any one of the plurality of first conductive patterns and the contact part of any one of the plurality of second conductive patterns are in contact with each other when the display device is excessively stretched in the first direction.

12. The display device of claim 9, wherein the contact part of another of the plurality of first conductive patterns and the contact part of another of the plurality of second conductive patterns are spaced apart from each other while overlapping each other in the first direction.

13. The display device of claim 12, wherein the contact part of another of the plurality of first conductive patterns and the contact part of another of the plurality of second conductive patterns are in contact with each other when the display device is excessively stretched in the second direction.

14. The display device of claim 1, wherein a plurality of plate patterns is between the lower substrate and the plurality of pixels, and the plurality of conductive patterns, and the plurality of plate patterns and the plurality of line patterns each have an elastic modulus higher than an elastic modulus of the lower substrate.

15. A display device comprising:

a lower substrate which is stretchable and having a first area, a second area, and a third area;

a plurality of conductive patterns disposed in the first area of the lower substrate;

a plurality of pixels disposed in the second area of the lower substrate; and a plurality of connection lines disposed in the third area of the lower substrate and respectively coupled to the plurality of pixels, wherein the plurality of conductive patterns comprises first conductive pattern and second conductive pattern spaced apart from each other, the first conductive pattern and the second conductive pattern being disposed on a same layer, and wherein a plurality of plate patterns is formed between the lower substrate and the plurality of pixels, a plurality of line patterns is formed between the lower substrate, the plurality of connection lines, and the plurality of conductive patterns, and the plurality of plate patterns and the plurality of line patterns each have an elastic modulus higher than an elastic modulus of the lower substrate.

16. The display device of claim 15, wherein the plurality of line patterns each have a curved shape.

17. The display device of claim 15, wherein the first conductive pattern and second conductive pattern are disposed symmetrically with respect to a center of the first area.

18. The display device of claim 17, wherein the first conductive pattern and second conductive pattern each comprise:

a plurality of first parts extending in a second direction; and at least one second part configured to couple the first parts and extending in a first direction.

19. The display device of claim 17, wherein the first conductive pattern and second conductive pattern are intertwined.

* * * * *